United States Patent
Danek et al.

(10) Patent No.: US 11,457,549 B2
(45) Date of Patent: Sep. 27, 2022

(54) SPINDLE MODULE, BANK, AND METHOD

(71) Applicant: Universal Instruments Corporation, Conklin, NY (US)

(72) Inventors: John Danek, Vestal, NY (US); Peter Joseph Dionne, Binghamton, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 72 days.

(21) Appl. No.: 16/992,756

(22) Filed: Aug. 13, 2020

(65) Prior Publication Data
US 2020/0407176 A1 Dec. 31, 2020

Related U.S. Application Data

(62) Division of application No. 16/969,751, filed as application No. PCT/US2018/019753 on Feb. 26, 2018.

(51) Int. Cl.
*H05K 13/04* (2006.01)
*B65G 47/90* (2006.01)
(Continued)

(52) U.S. Cl.
CPC ......... *H05K 13/0406* (2018.08); *B65G 47/90* (2013.01); *B65G 47/91* (2013.01);
(Continued)

(58) Field of Classification Search
CPC ............. H05K 13/0413; H05K 13/041; H05K 13/0409; H05K 13/0406
See application file for complete search history.

(56) References Cited

U.S. PATENT DOCUMENTS 3,342,396 A 9/1967 Miller
4,611,397 A 9/1986 Janisiewicz et al.
(Continued)

FOREIGN PATENT DOCUMENTS

CN 1170334 1/1998
CN 1210441 3/1999
(Continued)

OTHER PUBLICATIONS

Office Action (dated Jul. 7, 2021) for U.S. Appl. No. 16/992,918; Filing Date Aug. 13, 2020; GAU 3652.
(Continued)

*Primary Examiner* — Peter Dungba Vo
*Assistant Examiner* — Jose K Abraham
(74) *Attorney, Agent, or Firm* — Schmeiser, Olsen & Watts, LLP

(57) ABSTRACT

A pick-and-place spindle module comprises: a modular body structure including a first receiving location configured to receive a spindle; a first z-axis motor configured to move a spindle received in the first receiving location in a z-axis; a first theta motor configured to rotate a spindle received in the receiving location; a first motion control chip each attached to the body structure, the first motion control chip configured to control the first z-axis motor and the first theta motor; and a mechanical attachment mechanism, the mechanical attachment mechanism configured to facilitate attachment of the modular body structure to a spindle bank.

4 Claims, 17 Drawing Sheets

(51) Int. Cl.
  *B65G 47/91* (2006.01)
  *H05K 13/08* (2006.01)
  *H05K 13/02* (2006.01)
(52) U.S. Cl.
  CPC ......... *H05K 13/02* (2013.01); *H05K 13/0409* (2018.08); *H05K 13/0411* (2018.08); *H05K 13/0413* (2013.01); *H05K 13/0885* (2018.08)

(56) References Cited

U.S. PATENT DOCUMENTS

| | | | |
|---|---|---|---|
| 4,979,286 A | 12/1990 | Nakayama et al. | |
| 5,070,598 A | 12/1991 | Itagaki et al. | |
| 5,588,195 A * | 12/1996 | Asai | H05K 13/0406 29/33 M |
| 5,758,410 A | 6/1998 | Asai et al. | |
| 5,850,683 A | 12/1998 | Okazak et al. | |
| 5,855,059 A | 1/1999 | Togami et al. | |
| 6,195,165 B1 * | 2/2001 | Sayegh | H05K 13/0413 356/400 |
| 6,625,878 B2 | 9/2003 | Gieskes | |
| 6,684,490 B2 | 2/2004 | Chun et al. | |
| 7,017,261 B2 | 3/2006 | Okamoto et al. | |
| 7,036,215 B2 | 5/2006 | Kodama | |
| 7,281,323 B2 | 10/2007 | Hwang | |
| 7,302,755 B2 | 12/2007 | Ricketson | |
| 8,413,322 B2 | 4/2013 | Higuchi et al. | |
| 8,430,439 B2 | 4/2013 | Tsai et al. | |
| 8,769,809 B2 | 7/2014 | Masahiro | |
| 9,032,612 B2 | 5/2015 | Yamamoto et al. | |
| 9,247,685 B2 | 1/2016 | Youngquist | |
| 9,258,936 B2 | 2/2016 | Susumu | |
| 2001/0002380 A1 | 5/2001 | Tominaga et al. | |
| 2002/0004641 A1 | 1/2002 | Bellhouse et al. | |
| 2002/0088107 A1 | 7/2002 | Van De Rijdt et al. | |
| 2002/0088108 A1 | 7/2002 | Maldener et al. | |
| 2003/0183347 A1 | 10/2003 | Okawa et al. | |
| 2006/0112545 A1 | 6/2006 | Hwang | |
| 2006/0182585 A1 | 8/2006 | Lee et al. | |
| 2006/0196046 A1 | 9/2006 | Ricketson | |
| 2007/0089554 A1 | 4/2007 | Gieskes et al. | |
| 2007/0119143 A1 * | 5/2007 | Ricketson | H05K 13/0413 57/279 |
| 2007/0220741 A1 | 9/2007 | Gieskes et al. | |
| 2007/0293969 A1 * | 12/2007 | Hirai | H05K 13/0885 700/114 |
| 2008/0134498 A1 | 6/2008 | Gieskes et al. | |
| 2009/0229118 A1 | 9/2009 | Haugen | |
| 2009/0241327 A1 * | 10/2009 | Kashitani | H05K 13/0406 29/739 |
| 2010/0305756 A1 | 12/2010 | Hoshikawa | |
| 2011/0192021 A1 * | 8/2011 | Tanaka | H05K 13/041 29 |
| 2011/0214286 A1 | 9/2011 | Lee et al. | |
| 2011/0295428 A1 * | 12/2011 | Wang | G05B 19/4142 700/275 |
| 2012/0061155 A1 | 3/2012 | Berger et al. | |
| 2012/0159781 A1 | 6/2012 | Masahiro | |
| 2012/0234121 A1 | 9/2012 | Jensen et al. | |
| 2013/0219708 A1 | 8/2013 | Komatsu et al. | |
| 2014/0215812 A1 * | 8/2014 | Yamamoto | H05K 13/041 29/739 |
| 2015/0040384 A1 | 2/2015 | Nishiyama et al. | |
| 2015/0230369 A1 | 8/2015 | Danek et al. | |
| 2016/0021804 A1 | 1/2016 | Mantani et al. | |
| 2016/0100488 A1 * | 4/2016 | Brewel | H05K 13/08 29/832 |
| 2016/0174426 A1 | 6/2016 | Kurata | |
| 2016/0229121 A1 | 8/2016 | Ilic et al. | |
| 2017/0280597 A1 | 9/2017 | Maeda et al. | |
| 2019/0104658 A1 | 4/2019 | Hara | |
| 2020/0017317 A1 | 1/2020 | Yap et al. | |
| 2020/0369479 A1 | 11/2020 | Danek | |
| 2020/0375074 A1 | 11/2020 | Danek et al. | |
| 2020/0413580 A1 | 12/2020 | Danek et al. | |
| 2021/0007253 A1 | 1/2021 | Danek et al. | |

FOREIGN PATENT DOCUMENTS

| | | | | |
|---|---|---|---|---|
| CN | 1216214 | | 5/1999 | |
| CN | 1267186 | | 9/2000 | |
| CN | 1421118 | | 5/2003 | |
| CN | 1784141 | | 6/2006 | |
| CN | 101098618 | | 1/2008 | |
| CN | 101102661 | | 1/2008 | |
| CN | 101733439 | | 6/2010 | |
| CN | 102177771 | | 9/2011 | |
| CN | 102573441 | | 7/2012 | |
| CN | 103416115 | | 11/2013 | |
| CN | 104080324 | | 10/2014 | |
| CN | 102753006 B | * | 5/2015 | ........ H05K 13/041 |
| CN | 204652792 | | 9/2015 | |
| CN | 104476543 B | | 3/2016 | |
| CN | 102595868 B | * | 8/2016 | |
| CN | 206425599 | | 8/2017 | |
| EP | 2699071 A2 | | 2/2014 | |
| JP | 02139138 A | | 5/1990 | |
| JP | 0831712 B2 | | 3/1996 | |
| JP | 1041696 A | | 2/1998 | |
| JP | 1197899 A | | 4/1999 | |
| JP | 2005123371 A | | 5/2005 | |
| JP | 2008053575 A | | 3/2008 | |
| JP | 2008053576 A | | 3/2008 | |
| JP | 2008087151 A | | 4/2008 | |
| JP | 2009164394 A | | 7/2009 | |
| JP | 2011187983 A | | 9/2011 | |
| JP | 2012129434 A | | 7/2012 | |
| JP | 2012146762 | | 8/2012 | |
| JP | 2012146762 A | * | 8/2012 | |
| JP | 5043278 B2 | | 10/2012 | |
| JP | 2013135151 | | 7/2013 | |
| JP | 2013135151 A | | 7/2013 | |
| JP | 2013140600 | | 7/2013 | |
| JP | 2014107350 A | | 6/2014 | |
| JP | 2014123781 A | | 7/2014 | |
| JP | 2014160732 A | | 9/2014 | |
| JP | 2015530929 A | | 10/2015 | |
| JP | 2016004793 A | | 1/2016 | |
| KR | 20040110154 | | 12/2004 | |
| WO | 2013190608 A1 | | 2/2016 | |
| WO | 2016031053 A1 | | 6/2017 | |

OTHER PUBLICATIONS

International Search Report and the Written Opinion in corresponding PCT Patent Application No. PCT/US2018/019753 dated May 17, 2018. 17 pages.

U.S. Appl. No. 16/969,751, filed Aug. 13, 2020; Confirmation No. 6929; Customer No. 05409.

U.S. Appl. No. 16/992,620, filed Aug. 13, 2020; Confirmation No. 1092; Customer No. 05409.

U.S. Appl. No. 16/992,686, filed Aug. 13, 2020; Confirmation No. 1039; Customer No. 05409.

U.S. Appl. No. 16/992,835, filed Aug. 13, 2020; Confirmation No. 9707; Customer No. 05409.

U.S. Appl. No. 16/992,918, filed Aug. 13, 2020; Confirmation No. 6343; Customer No. 05409.

* cited by examiner

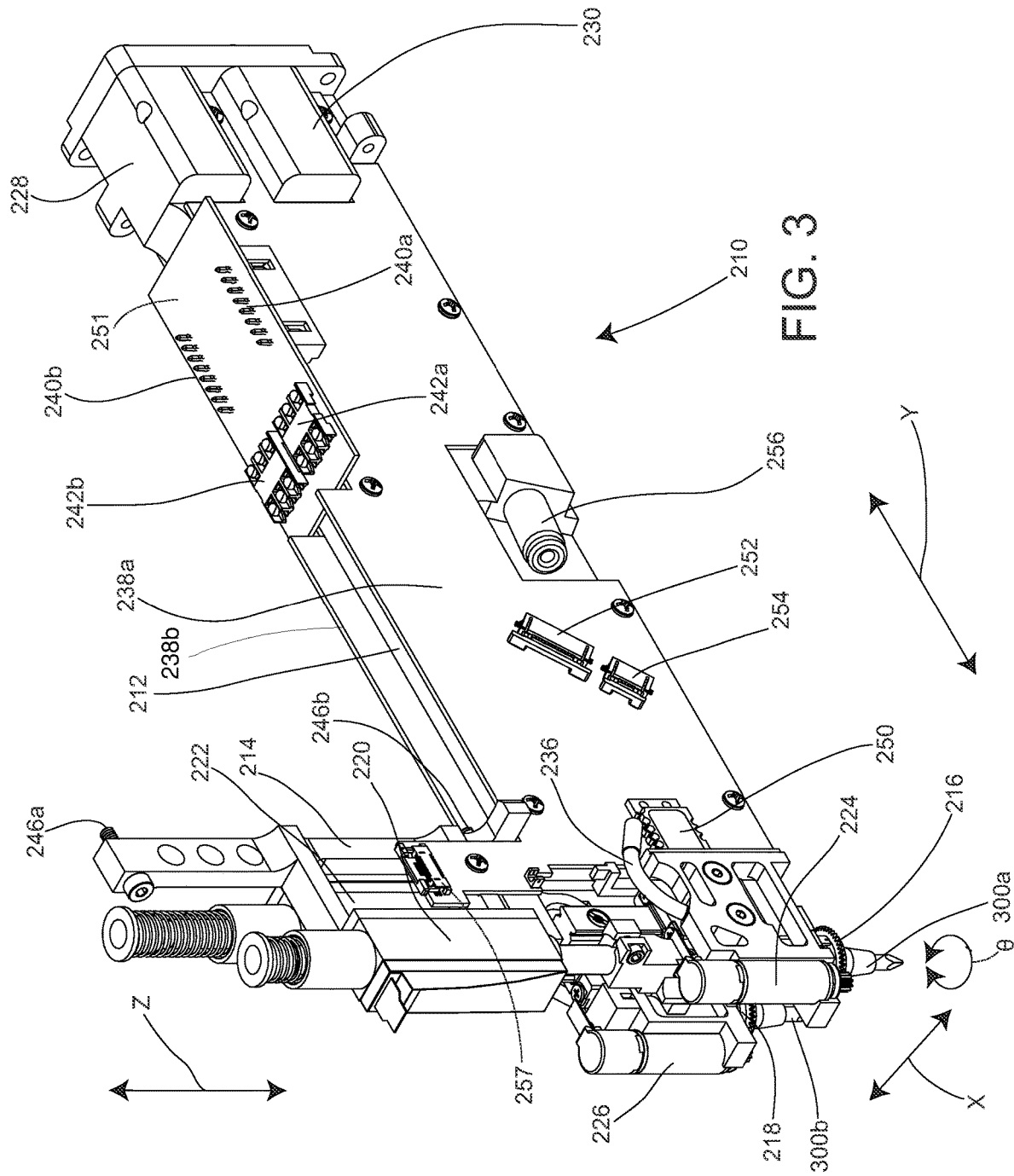

SPINDLE MODULE, BANK, AND METHOD

RELATED APPLICATIONS

This application claims priority to U.S. patent application Ser. No. 16/969,751, filed Aug. 13, 2020, entitled "Dispensing Head, Nozzle and Method," which claims priority to International Patent Application No. PCT/US2018/019753, filed Feb. 26, 2018, entitled "Dispensing Head, Nozzle and Method," the disclosures of which are hereby incorporated by reference to the extent that is it not inconsistent with the present disclosure.

BACKGROUND

Assembly machines include complex robots that have dispensing heads that move along one or more axis to assemble an unfinished product. Dispensing heads may be capable of picking, placing, providing material to a component or surface, manipulating, screwing, or otherwise dispensing of a task or material. In pick-and-place assembly machines, for example, dispensing heads are often configured to receive multiple different spindle and nozzle assemblies in order to pick, place, and assemble various different parts efficiently. Dispensing heads must often include a spindle assembly for creating rotation in a nozzle, along with the ability to move the nozzle in the Z-axis. As a result of these requirements, dispensing heads for pick-and-place machines are often heavy and have a large volume.

Further, assembly machines may include multi-spindle or multi-nozzle dispensing heads. These dispensing heads may be configured to, for example, pick up multiple components from one or more feeder banks, and then move to a placement location to place the multiple components. This reduces assembly time compared to having a single spindle or single nozzle. This is because single spindle and nozzle arrangements will typically require the back and forth movement between the feeder banks and the placement location with each placed component. However, with additional spindles and nozzle receivers located on a dispensing head, the size, volume and engineering complexity of the head is often increased. Further, if one spindle or nozzle breaks or begins functioning improperly, the entire dispensing head may be compromised until such a problem is fixed.

Moreover, present dispensing heads for pick-and-place systems are typically controlled by machine level processors or control systems. These systems preclude the creation of an independent motion control profile for each individual spindle on a multi-spindle dispensing head. Rather, motion control profiles are created on a dispensing head level.

Thus, improved assembly machines, dispensing heads, spindles, spindle mounting modules and spindle banks to alleviate or reduce one or more of the above limitations would be well received in the art.

BRIEF DESCRIPTION

According to one embodiment, a spindle for a pick-and-place machine comprises: a shaft including a length extending between a first end and a second end, the shaft including an outer body and a hollow interior; a nozzle tip disposed at the first end of the shaft, the nozzle tip configured to contact an electronic component for manipulation of the electronic component; and a theta gear disposed on the shaft, the theta gear configured to engage with a motor of a pick-and-place head, wherein the spindle is configured to be removably attachable from the pick-and-place head.

According to another embodiment, a method of assembly comprises: providing a pick-and-place machine having a pick-and-place head; providing a spindle for the pick-and-place machine, the spindle including: a shaft including a length extending between a first end and a second end, the shaft including an outer body and a hollow interior; a nozzle tip disposed at the first end of the shaft; a theta gear disposed on the shaft; attaching the spindle to the pick-and-place head of the pick-and-place machine; engaging, by the theta gear, with a motor of the pick-and-place head; contacting, by the spindle, an electrical component; manipulating, by the spindle, the electrical component; and removing the spindle from the pick-and-place head of the pick-and-place machine.

According to another embodiment, a dispensing head comprises: a body structure including a receiving location; a z-axis motor; a theta motor; a spindle received in the receiving location, the spindle comprising: a shaft including a length extending between a first end and a second end, the shaft including an outer body and a hollow interior; a nozzle tip disposed at the first end of the shaft, the nozzle tip configured to contact an electronic component for manipulation of the electronic component; and a theta gear disposed on the shaft, the theta gear configured to engage with the theta motor such that the theta motor is configured to rotate the theta gear.

According to another embodiment, a spindle bank for a pick-and-place machine comprises: a base including a plurality of mount locations, each of the plurality of mount locations configured to receive a mountable spindle module including at least one pick-and-place spindle and nozzle; and a bearing system attachable to a movement axis of a pick-and-place machine such that the spindle bank is movable along the movement axis.

According to another embodiment, a pick-and-place machine comprises: a feeder location configured to present electronic components for picking; a placement location configured to receive an unfinished product to place the electronic components; a first movement axis; and a spindle bank including: a base including a plurality of mount locations, each of the plurality of mount locations configured to receive a mountable spindle module including at least one pick-and-place spindle and nozzle; and a bearing system attachable to the first movement axis such that the spindle bank is movable along the first movement axis.

According to another embodiment, a method of assembly comprising: providing a pick-and-place machine having a first movement axis; providing a spindle bank for a pick-and-place machine including: a base including a plurality of mount locations; and a bearing system attachable to the first movement axis of a pick-and-place machine such that the spindle bank is movable along the axis; and mounting, on each of the plurality of mount locations, a mountable spindle module including at least one pick-and-place spindle and nozzle; and assembling, by the received mountable spindle modules, at least one unfinished product.

According to another embodiment, a pick-and-place spindle module comprises: a modular body structure including a first receiving location configured to receive a spindle; a first z-axis motor configured to move a spindle received in the first receiving location in a z-axis; a first theta motor configured to rotate a spindle received in the receiving location; an air distribution system including an air distribution port, the air distribution system configured to deliver received air from the air distribution port to a spindle received in the first receiving location; an electrical distribution system including an electrical distribution port, the electrical distribution system configured to deliver received electricity from the electricity distribution port to the first z-axis motor and the first theta motor; and a mechanical attachment mechanism, the mechanical attachment mechanism configured to facilitate attachment of the modular body structure to a spindle bank such that the air distribution port is connected to receive air from the spindle bank and the electrical distribution port is configured to receive electricity from the spindle bank.

According to another embodiment, a method of assembly comprises: providing a pick-and-place machine having a first movement axis; providing a spindle bank attached to the pick and place machine such that the spindle bank is movable along the first movement axis: providing a first pick-and-place spindle module including: a modular body structure including a first receiving location; a first z-axis motor; a first theta motor; an air distribution system including an air distribution port; an electrical distribution system including an electrical distribution port; and a mechanical attachment mechanism; attaching, using the mechanical attachment mechanism, the first pick-and-place spindle module to the spindle bank such that the air distribution port is connected to receive air from an element of the spindle bank and the electrical distribution port is connected to receive electricity from an element of the spindle bank; receiving, by the receiving location of the modular body structure, a first spindle; moving, by the first z-axis motor, the received first spindle in a z-axis; rotating, by the first theta motor, the received first spindle; delivering, by the air distribution system, received air from the air distribution port to the received first spindle; delivering, by the electrical distribution system, received electricity from the electrical distribution port to the received first spindle; moving the spindle bank along the first movement axis; and at least partially assembling, by the attached first pick-and-place spindle module, at least one unfinished product.

According to another embodiment, a pick-and-place machine comprises: a feeder location configured to present electronic components for picking; a placement location configured to receive an unfinished product to place the electronic components; a first movement axis; a spindle bank movable along the first movement axis; and a pick-and-place spindle module attached to the spindle bank including: a modular body structure including a first receiving location configured to receive a spindle; a first z-axis motor configured to move a spindle received in the first receiving location in a z-axis; a first theta motor configured to rotate a spindle received in the receiving location; an air distribution system including an air distribution port, the air distribution system configured to deliver received air from the air distribution port to a spindle received in the first receiving location; an electrical distribution system including an electrical distribution port, the electrical distribution system configured to deliver received electricity from the electricity distribution port to the first z-axis motor and the first theta motor; and a mechanical attachment mechanism, the mechanical attachment mechanism attaching the modular body structure to the spindle bank such that the air distribution port is connected to receive air and the electrical distribution port is configured to receive electricity.

According to another embodiment, a pick-and-place spindle module comprises: a modular body structure including a first receiving location configured to receive a spindle; a first z-axis motor configured to move a spindle received in the first receiving location in a z-axis; a first theta motor configured to rotate a spindle received in the receiving location; a first motion control chip each attached to the body structure, the first motion control chip configured to control the first z-axis motor and the first theta motor; and a mechanical attachment mechanism, the mechanical attachment mechanism configured to facilitate attachment of the modular body structure to a spindle bank.

According to another embodiment, a pick-and-place spindle bank comprises: a base including a plurality of mount locations; a bearing system attachable to an axis of a pick-and-place machine such that the spindle bank is movable along the axis; and a first pick-and-place spindle module mounted to a first of the plurality of mount locations, the first pick-and-place spindle module including: a modular body structure including a first receiving location configured to receive a spindle; a first z-axis motor configured to move a spindle received in the first receiving location in a z-axis; a first theta motor configured to rotate a spindle received in the first receiving location; a first motion control chip each attached to the modular body structure, the first motion control chip configured to control the first z-axis motor and the first theta motor; and a mechanical attachment mechanism attaching the modular body structure to the base.

According to another embodiment, a pick-and-place head comprises: a body structure; a plurality of z-axis motors attached to the body structure, each configured to move a spindle in a z-axis; a plurality of theta motors attached to the body structure each configured to rotate a spindle; and a plurality of motion control chips each attached to the body structure, each of the plurality of motion control chips configured to control a single one of the plurality of z-axis motors and a single one of the plurality of theta motors.

According to another embodiment, a method of assembly comprises: providing a pick-and-place head that includes: a body structure; a plurality of z-axis motors attached to the body structure, each configured to move a spindle in a z-axis; a plurality of theta motors attached to the body structure each configured to rotate a spindle; and a plurality of motion control chips each attached to the body structure, controlling, with each of the plurality of motion control chips, a single one of the plurality of z-axis motors and a single one of the plurality of theta motors; and at least partially assembling, with the pick and place head, an unfinished product.

According to another embodiment, a pick-and-place dispensing head comprises: a body structure including a first z-axis motor attachment location, a second z-axis motor attachment location, a first linear track and a second linear track; a first z-axis motor attached to the body structure at the first z-axis motor attachment location; a second z-axis motor attached to the body structure at the second z-axis motor attachment location; a first body attached to the first linear track and operably connected to the first z-axis motor such that the first body moves along the first linear track when the first z-axis motor is actuated; a second body attached to the second linear track and operably connected to the second z-axis motor such that the second body moves along the second linear track when the second z-axis motor is actuated; a first theta motor operably connected to the first body; a second theta motor operably connected to the second body; a first receiving location operably connected to the first body, the first receiving location configured to receive a pick-and-place spindle, wherein the first theta motor is configured to rotate a pick-and-place spindle received in the first receiving location; and a second receiving location operably connected to the second body, the second receiving location configured to receive a pick-and-place spindle, wherein the second theta motor is configured to rotate a pick-and-place spindle received in the second receiving location, wherein the first linear track and the second linear track are attached to the body structure with a set screw extending between a first nut and a second nut.

According to another embodiment, a pick-and-place dispensing head comprises: a body structure extending in an x-axis, a y-axis perpendicular to the x-axis, and a z-axis perpendicular to the x-axis and the y-axis, the body structure including a first z-axis motor attachment location, a second z-axis motor attachment location, a first linear track extending along the z-axis and a second linear track extending along the z-axis; a first z-axis motor attached to the body structure at the first z-axis motor attachment location, the first z-axis motor configured to exact movement in the z-axis; a second z-axis motor attached to the body structure at the second z-axis motor attachment location, the second z-axis motor configured to exact movement in the z-axis; a first body attached to the first linear track and operably connected to the first z-axis motor such that the first body moves along the first linear track when the first z-axis motor is actuated; a second body attached to the second linear track and operably connected to the second z-axis motor such that the second body moves along the second linear track when the second z-axis motor is actuated; a first theta motor operably connected to the first body; a second theta motor operably connected to the second body; a first receiving location operably connected to the first body, the first receiving location configured to receive a pick-and-place spindle, wherein the first theta motor is configured to rotate a pick-and-place spindle received in the first receiving location; and a second receiving location operably connected to the second body, the second receiving location configured to receive a pick-and-place spindle, wherein the second theta motor is configured to rotate a pick-and-place spindle received in the second receiving location, wherein the first receiving location and the second receiving location are spaced apart along the x-axis and located at a same location along the y-axis, wherein the first z-axis motor and the second z-axis motor are spaced apart along the x-axis and spaced apart on the y-axis.

According to another embodiment, a pick-and-place dispensing head comprises: a body structure having a z-axis motor attachment location and a linear track; a z-axis motor attached to the body structure at the axis motor attachment location, the z-axis motor configured to exact movement in a z-axis; a body attached to the linear track and operably connected to the z-axis motor such that the body moves along the linear track when the z-axis motor is actuated; a theta motor operably connected to the first body; a receiving location operably connected to the body, the receiving location configured to receive a pick-and-place spindle such that the pick-and-place spindle is configured to move relative the body in the z-axis when an upward z-axis force is applied to the pick-and-place spindle, the receiving location including a spring mechanism configured to return the spindle to a start position after actuation by the z-axis motor, and wherein the first theta motor is configured to rotate a pick-and-place spindle received in the first receiving location and remain engaged with the pick-and-place spindle during z-axis movement of the pick-and-place spindle; and an optical detector extending from the first body configured to detect upward z-axis movement of a received pick-and-place spindle relative to the body.

BRIEF DESCRIPTION OF THE DRAWINGS

Some embodiments of this invention will be described in detail, with reference to the following figures, wherein like designations denote like members, wherein:

FIG. 3 depicts a perspective view of a spindle module in accordance with one embodiment;

DETAILED DESCRIPTION

A detailed description of the hereinafter described embodiments of the disclosed apparatus and method are presented herein by way of exemplification and not limitation with reference to the Figures.

Figure 1:
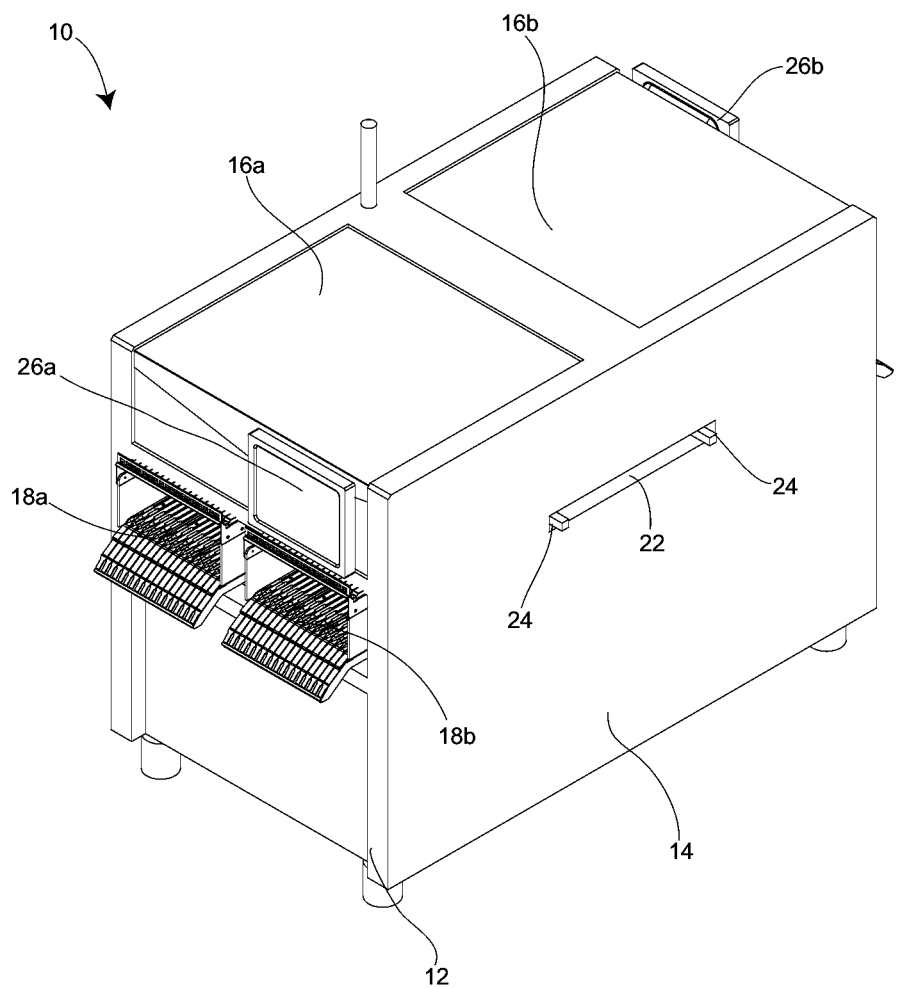
FIG. 1 depicts a perspective view of an assembly machine in accordance with one embodiment.

Referring to FIG. 1, an assembly machine 10 is shown. The assembly machine 10 is a pick-and-place machine configured to assemble printed circuit boards (PCB's) in the embodiment shown. For example, the assembly machine may be an advanced packaging assembly machine, a component assembly machine, or the like. In other embodiments, the features described herein may be applied to various other assembly machines such as odd form assembly machines (OFA), or the like. The Assembly machine 10 includes a frame 12 providing structure a body 14 having covers 16a, 16b. The frame 12 may include a plurality of legs upon which the assembly machine 10 is configured to stand. The assembly machine 10 includes a plurality of feeder banks 18a, 18b. A plurality of feeders 20 are disposed (shown in FIG. 2A), attached, or otherwise mounted to each of the feeder banks 18a, 18b. The feeders 20 may each include a plurality of electronic components that the assembly machine 10 is configured to pick-and-place onto a PCB to assemble or at least partially assemble the PCB. The assembly machine 10 further includes a board handling opening 22. A board handling track 24 may extend within the body 14 of the assembly machine 10 extending between the opening 22 and another opening on the opposing side of the assembly machine (not shown). The board handling track 24 may be configured to receive a PCB or another unfinished product and transport the PCB to a placement location within the body of the assembly machine 10 for assembly. The assembly machine 10 is shown further including operator interface and control displays 26a, 26b, one on each side. The display 26 may be configured to receive user or operator inputs and display information necessary or useful to a user or operator. While the features of the assembly machine 10 shown are one exemplary embodiment, aspects of the invention described herein are applicable to various other types of assembly machines as will be apparent to those skilled in the art.

Figure 2A:
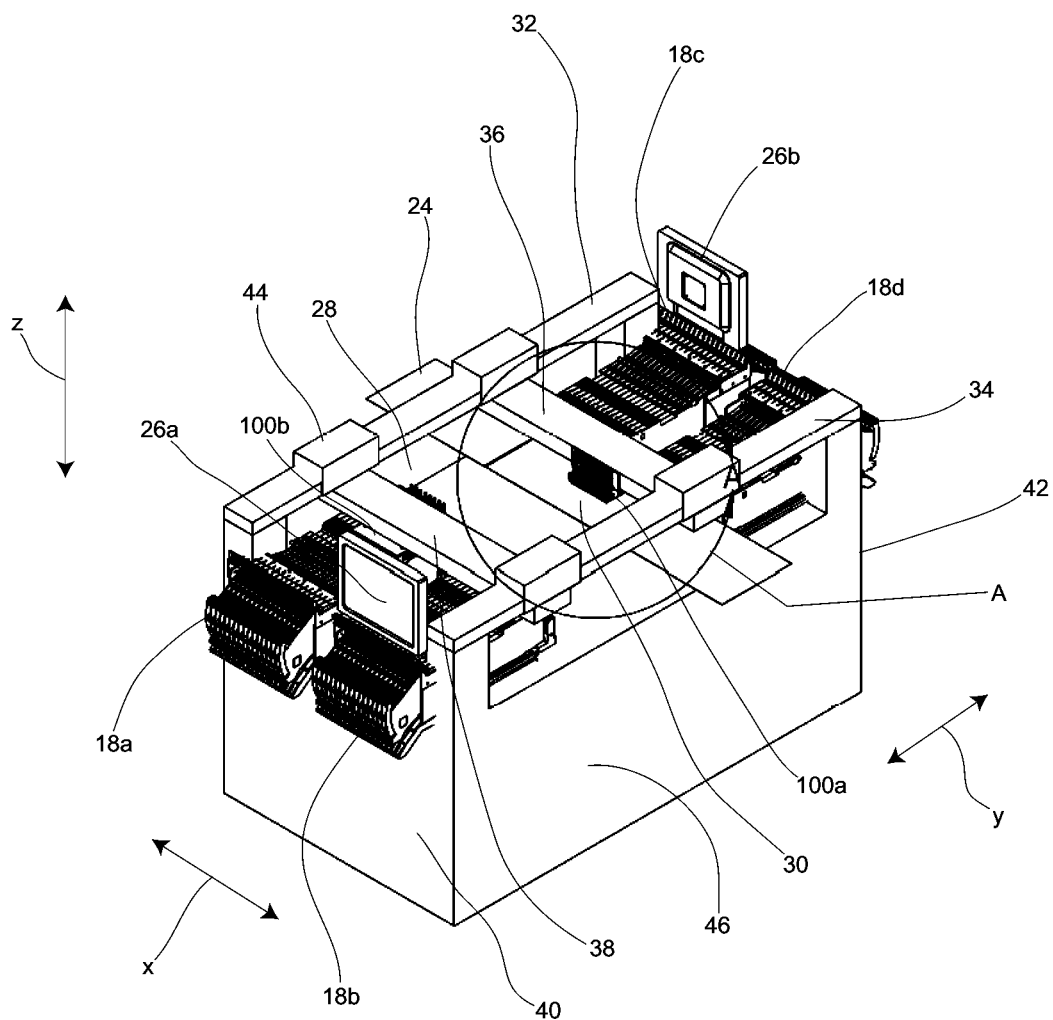
FIG. 2A depicts a perspective view of the assembly machine of FIG. 1 with covers removed in accordance with one embodiment.

Referring now to FIG. 2A, the assembly machine 10 is shown with the covers 16a, 16b removed exposing an interior 28 of the assembly machine 10. The assembly machine 10 includes two additional feeder banks 18c, 18d disposed on the opposite side of the body 14 as the feeder banks 18a, 18b. The board handling track 24 may be located between the feeder banks 18a, 18b and 18c, 18d. The board handling track 24 may be configured to provide an unfinished product such as a PCB to a placement station 30 located along the track 24.

The assembly machine 10 may facilitate movement of components in three movement axes: an x-axis, a y-axis and a z-axis. Hereinafter, the x-axis may be an axis extending parallel to the board handling track 24. The y-axis may be perpendicular to the x-axis and the board handling track 24. The z-axis may be an up and down or vertical axis. The assembly machine 10 may include a plurality of movement axes 32, 34, 36, 38 for facilitating movement in the x-axis and the y-axis. In particular, the assembly machine 10 may include a first movement axis 32 and a second movement axis 34 that are configured to facilitate movement in the y-axis. The assembly machine 10 may include a third movement axis 36 and a second movement axis 38 that are configured to facilitate movement in the x-axis. The first and the second movement axis 32 may extend along a depth of the machine between a first side 40 and a second side 42. The first side 40 is the side of the assembly machine 10 proximate the first and second feeder banks 18a, 18b. The second side 42 is the side of the assembly machine 10 proximate the third and fourth feeder banks 18c, 18d. The third and fourth movement axes 36, 38 are shown connected to the first and second movement axes 32, 34 and extend there between. During operation of the assembly machine 10, the third and fourth movement axes 36, 38 are configured to each independently move along the first and second movement axes 32, 34 to provide for movement in the y-axis. A spindle bank 100a, 100b is shown movably attached to each of the third and fourth movement axes 36, 38, respectively. The spindle banks 100a, 100b may each be configured to move along the x-axis by moving along the respective third and fourth movement axes 36, 38. In other embodiments, the assembly machine 10 may be a single-moveable axis machine. For example, there may be a single x-axis and a single y-axis connectable to the assembly machine, rather than two of each as shown in the embodiment in the Figures.

With the movement axes 32, 34, 36, 38, the spindle banks 100a, 100b within the assembly machine 10 are configured for both x-axis and y-axis freedom of operation within the interior 28. This allows the spindle banks 100a, 100b to move back and forth to and from the feeder banks 18a, 18b, 18c, 18d and the placement station 30. This is accomplished by both the movement of the spindle banks 100a, 100b along the respective third and fourth movement axes 36, 38, and the movement of the third and fourth movement axes 36, 38 along the first and second movement axes 32, 34. Other forms of x-axis and y-axis movement within the assembly machine 10 are contemplated and the movement axes shown are for exemplary purposes.

Figure 2B:
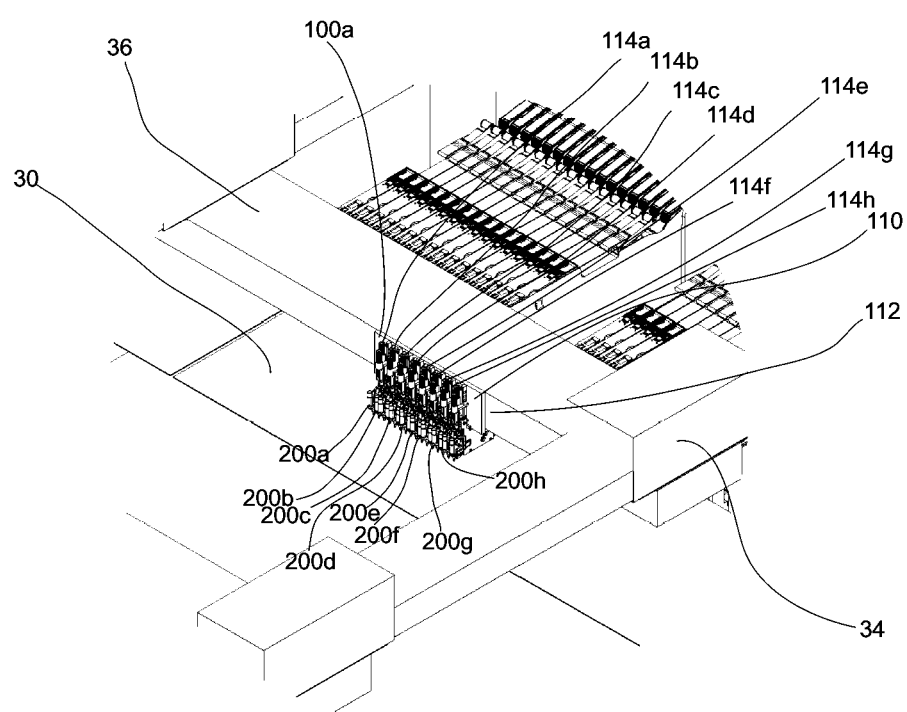
FIG. 2B depicts a perspective view of a portion of the assembly machine of FIG. 2A enlarged at circle A in accordance with one embodiment.

Referring now to FIG. 2B, a perspective view of a portion of the assembly machine 10 enlarged at circle A (from FIG. 2A) is shown. The enlarged portion shows the spindle bank 100a having a base 110 and a bearing system 112. The base 110 may be a body, housing, structure or the like. The base 110 may include a plurality of mount locations 114a, 114b, 114c, 114d, 114e, 114f, 114g, 114h each configured to receive a spindle module 200a, 200b, 200c, 200d, 200e, 200f, 200g, 200h, respectively. The spindle modules described herein may be pick-and-place spindle modules particularly configured for receiving spindle and nozzle combinations that are configured to pick, place, or otherwise manipulate electronic components for printed circuit board assembly and picking and placement processes. The spindle modules described herein may also be utilized for other assembly processes where one or more rotatable and/or descendible manipulating spindles are necessary to perform at least a portion of an assembly process for assembling an unfinished product.

The bearing system 112 may be a system that provides for movement of the spindle bank 100a along the third movement axis 36. The bearing system 112 may include wheels to facilitate movement between the spindle bank 100a and the movement axis 36. In other embodiment, the bearing system 112 may include magnets to facilitate magnetic movement between the spindle bank 100a and the third movement axis 36. The third movement axis 36 may include a track structure on the underside (not shown) that may cooperate with a track structure bearing system of the spindle bank 100a. For example, the spindle bank 100 may include track runner bearings configured to cooperate with a track of the third movement axis 36. A motor or other movement creating mechanism may provide for controlled powered movement of the spindle bank 100 along the third movement axis 36. The motor may be located on the spindle bank itself 100, or may be located on the third movement axis 36. Thus, the spindle bank 100 may include one or more electrical ports, connectors or the like to connect to an electrical system of the assembly machine 10 to thereby provide electrical power to the spindle bank 100. The spindle bank 100 may utilize this electricity to power a motor or otherwise provide motion, movement, or acceleration of the spindle bank 100 relative to the third movement axis 36.

The mount locations 114a, 114b, 114c, 114d, 114e, 114f, 114g, 114h may provide for modularity in the spindle bank 100a such that the spindle bank 100a may be operable with each of the spindle modules 200a, 200b, 200c, 200d, 200e, 200f, 200g, 200h attached or with a single one of the spindle modules. In other words, the spindle bank 100a may be operable no matter how many of the spindle modules 200a, 200*b*, 200*c*, 200*d*, 200*e*, 200*f*, 200*g*, 200*h* are installed into the mount locations 114*a*, 114*b*, 114*c*, 114*d*, 114*e*, 114*f*, 114*g*, 114*h*. If one of the spindle modules 200*a*, 200*b*, 200*c*, 200*d*, 200*e*, 200*f*, 200*g*, 200*h* breaks or is need of repair, the spindle bank 100*a* may be operable. Further, while the spindle modules 200*a*, 200*b*, 200*c*, 200*d*, 200*e*, 200*f*, 200*g*, 200*h* shown are all the same or similar, the mount locations 114*a*, 114*b*, 114*c*, 114*d*, 114*e*, 114*f*, 114*g*, 114*h* may each be configured to receive different types of spindle modules with different types of spindles, nozzles and the like. The mount locations 114*a*, 114*b*, 114*c*, 114*d*, 114*e*, 114*f*, 114*g*, 114*h* may each have the same physical mounting properties such that the spindle modules 200*a*, 200*b*, 200*c*, 200*d*, 200*e*, 200*f*, 200*g*, 200*h* may each include the same mounting properties, making each module interchangeably attachable to any mount location. In other embodiments, the spindle bank 100*a* may include mount locations that have different physical attachment properties to provide for attachment of modules having different attachment mechanisms or properties than other modules attachable in other mount locations on the spindle bank 100*a*.

Referring now to FIG. 3, a spindle module 200 is shown. The spindle module may be the same as one of the spindle modules 200*a*, 200*b*, 200*c*, 200*d*, 200*e*, 200*f*, 200*g*, 200*h* shown in FIG. 2B. The spindle module 200 is shown including a modular body structure 210. The modular body structure may include a first body structure 212 and a second body structure 214 mounted or attached to the first body structure 212. The second body structure 214 includes a first receiving location 216 configured to receive a first spindle 300*a*, and a second receiving location 218 configured to receive a second spindle 300*b*.

The spindle module 200 further includes a first z-axis motor 220 and a second z-axis motor 222, each mounted to the second body structure 214. The first z-axis motor 220 may be configured to move the first spindle 300*a* in the z-axis direction. Similarly, the second z-axis motor 222 may be configured to move the second spindle 300*b* in the z-axis direction. The spindle module 200 further includes a first theta motor 224 and a second theta motor 226. The first theta motor 224 may be configured to rotate the first spindle 300*a* in a theta (θ) rotational axis. The second theta motor 226 may be configured to rotate the second spindle 300*b* in the theta (θ) rotational axis. The first and second theta motors 224, 226 may be configured to provide theta axis rotation in either directions. Thus, the spindle module 200 may provide for movement in the z-axis and rotational movement in the theta (θ) rotational axis. The spindle module 200 may provide for independent movement for each of the first and second spindles 300*a*, 300*b*.

The spindle module 200 may further include an air distribution system that includes one or more valves 228, 230, first and second air distribution ports 232, 234 (shown in FIGS. 12A and 13A), along with two airflow tubes 236 (one shown), each providing vacuum generating airflow to the first and second spindles 300*a*, 300*b*. The air distribution system may further include a pneumatic connector 256 (one shown) on each side. The first and second air distribution ports 232, 234 may each be configured to receive air from an air distribution system of the assembly machine 10 and deliver the received air to the first and second spindles 300*a*, 300*b*. After receiving the air at the air distribution ports 232, 234, internal airflow tubes (not shown) may provide this airflow to the pneumatic connectors 256. The airflow tubes 236 may connect to the pneumatic connectors 256 by elongating the airflow tubes or using another tube that connects the pneumatic connectors 256 to the airflow tubes 236, respectively. In the embodiment shown, the first valve 228 is housed within a widened portion of the first body structure 214, and may provide for air-kiss forward air pressure. The second valve 230 is also shown to be housed within a widened portion of the first body structure 214, and may be a valve for providing vacuum pressure for picking up a component with the first and second spindles 300*a*, 300*b*.

The spindle module 200 may have a first outer body 238*a* and a second outer body 238*b* mounted to the first body structure 212 with several screws. The outer bodies 238*a*, 238*b* may be a first circuit board and a second circuit board. As shown, the spindle module 200 includes an electrical distribution system including a second circuit board assembly 251 containing a plurality of electrical distribution ports 242*a*, 242*b* configured to receive electricity from the assembly machine 10 and/or the spindle bank 100*a* or 100*b* when attached and deliver the received electricity to the first and second z-axis motors 220, 222 and the first and second theta motors 224, 226. When the spindle module 200 is attached to the assembly machine 10, each of the electrical distribution ports 242*a* and 242*b* may be attached to electrical connectors of the assembly machine 10 or spindle bank 100*a* or 100*b*.

In one embodiment, the ports 240*a*, 240*b* may be configured to deliver electricity from the distribution ports 242*a* and 242*b* to the circuit board assembly 238*a* and 238*b* and to electrical connectors 252, 254, 257. It should be understood that duplicate electrical connectors to the electrical connectors 252, 254 and 257 are found on the opposite side of the outer body 238*a*. Thus, electricity may travel through the port 242*a* through 240*a* and 238*a* and through the electrical connector 257, and through a cable (not shown) to the first z-axis motor 220. Similarly, electricity may travel through the port 242*a*, through 240*a* and 238*a* through the electrical connector 252 and through a cable (not shown) to the first theta motor 224. Connector 254 may be used to connect to a spindle module optical detector 550 (described herein below, cable not shown) to the motion control chip 250 located on 238*a*. This electrical arrangement may be duplicated on the other side with respect to the printed circuit board second outer body 238*b*.

The spindle module 200 may include one or more mechanical attachment mechanisms to facilitate attachment of the spindle module 200 to the assembly machine 10, for example to a spindle bank such as one of the spindle banks 100*a*, 100*b*. In the embodiment shown, the mechanical attachment mechanisms comprise a first threaded screw 246*a* and a second threaded screw 246*b*. In one embodiment, the mechanical attachment mechanism may be capable of attachment with only a non-powered hand tool such as a screw driver, Allen wrench, wrench, or the like. In the embodiment shown, the first and second threaded screws 246*a*, 246*b* may be turned by an Allen wrench at bolt heads 248*a*, 248*b* (shown in FIG. 5). Further, the tightening of the threaded screws 246*a*, 246*b* may be the only procedure or step required to attach the spindle module 200 to one of the spindle banks 100*a*, 100*b*. Similarly, the loosening of the threaded screws 246*a*, 246*b* may be the only procedure or step required to unattach or remove the spindle module 200 from one of the spindle banks 100*a*, 100*b*.

The attachment of the spindle module 200 may be completed, executed or performed such that the air distribution ports are connectable to receive air from the assembly machine 10 and/or the spindle bank 100*a* or 100*b*, and the electrical distribution port is configured to receive electricity from the assembly machine 10 and/or the spindle bank 100*a* or 100*b*. The spindle module 200 may not be attachable directly to any movement axis of the assembly machine 10, such as the first, second, third or fourth movement axes 32, 34, 36, 38. Instead, the spindle module 200 may be attachable to one of the spindle banks 100a, 100b which in turn may be attachable to one or more of the first, second, third or fourth movement axes 32, 34, 36, 38.

The spindle module 200 may further include a first motion control chip 250 attached to the first body structure 212 proximate the second body structure 214 and the motors 220, 222, 224, 226. An opposite side of the first body structure 212 may include a second motion control chip (not shown) in a mirrored location as the first motion control chip 250. The first motion control chip 250 may each be configured to control the first z-axis motor 220 and the first theta motor 224. The motion control chip 250 may thus be a dedicated control chip, processor, or the like, configured to control only one of the two spindles 300a, 300b contained in the spindle module 200, in particular the first spindle 300a. The second motion control chip may be a dedicated control chip, processor, or the like configured to control the second spindle 300b. Each of the first motion control chip 250 and the second motion control chip may be configured to control speed, acceleration and position of the respective first and second z-axis motors 220, 222 and the first and second theta motors 224, 226. Further, each of the first motion control chip 250 and the second motion control chip may be configured to create an independent and/or separate motion control profile for each of the first and second spindles 300a, 300b, respectively.

Figure 4:
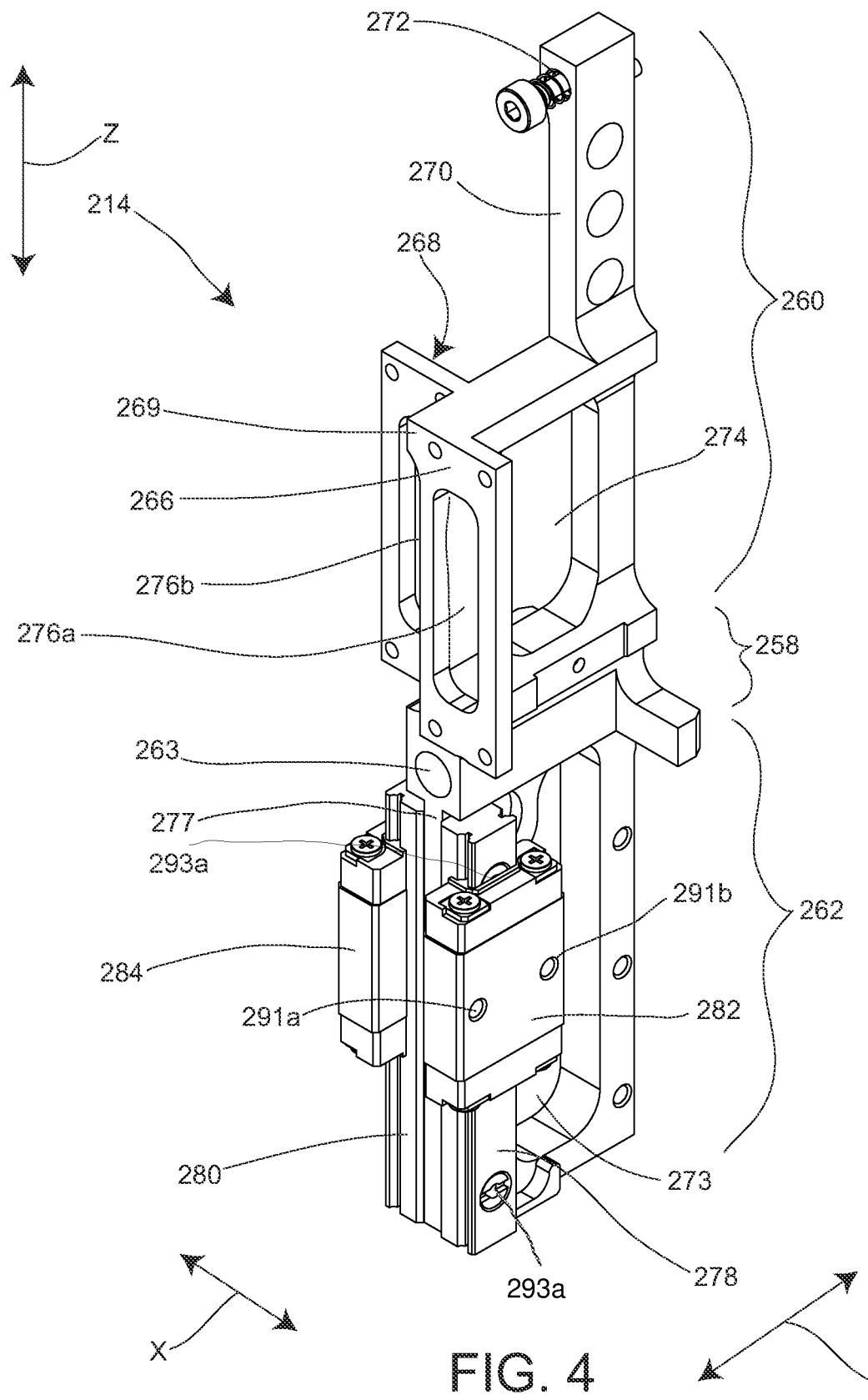
FIG. 4 depicts a perspective view of a body structure of the spindle module in accordance with one embodiment.
Figure 5:
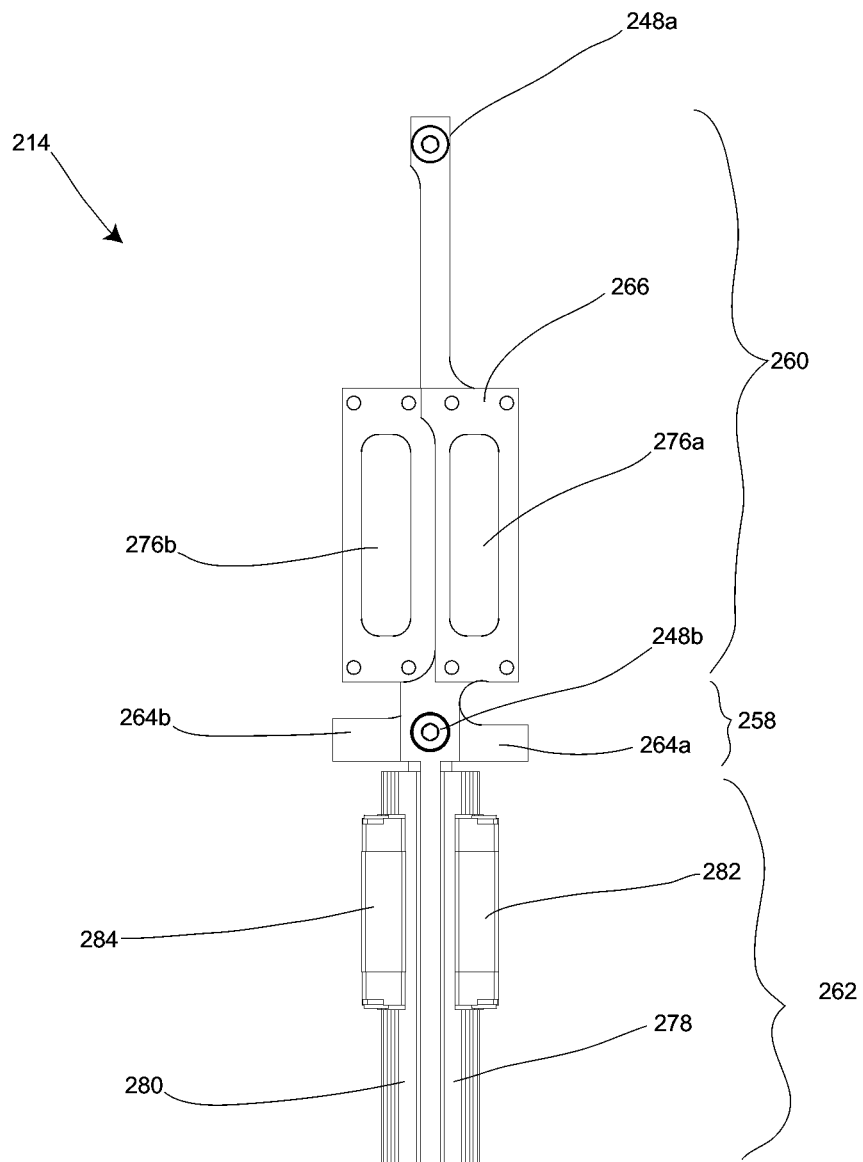
FIG. 5 depicts a front view of the body structure of FIG. 4 in accordance with one embodiment.

Referring now to FIGS. 4 and 5, a perspective view and side view, respective, of the second body structure 214 is shown prior to attachment with the first body structure 212. The second body structure 214 includes a middle structural portion 258, an upper structural portion 260 and a lower structural portion 262. The second body structure 214 may be a machined metallic component consistent with the dimensions shown. The second body structure 214 may be configured to receive for attachment the first and second z-axis motors 220, 222, and may include the support structure to allow for moveable attachment along the z-axis of the first and second theta motors 224, 226, as described in more detail herein below.

The middle structural portion 258 may include an opening 263 or bore configured to receive the second threaded screw 246b and the head 248b thereof. The middle structural portion 258 may include a square or rectangular cross section extending in the direction of the opening 263 and surrounding the opening 263. A back end of the middle structural portion 258 may include extending support flanges 264a, 264b configured for supporting the second body structure 214 when mounted to the first body structure 212.

The upper structural portion 260 extends upward from the middle structural portion 258. The upper structural portion 260 includes a depth extending from a front end 269 along the y-axis. The upper structural portion 260 includes an upper rectangular removed portion 274 configured to reduce the weight of the second body structure 214. The upper structural portion 260 includes a first z-axis motor mount face 266 and a second z-axis motor mount face 268. The first z-axis motor mount face 266 is shown flush to the front end 269 of the upper structural portion 260 while the second z-axis motor mount face 268 extends from a middle point along the depth of the upper structural portion, the middle point being closer to the front end 269 than the opposing rear end. The first z-axis motor mount face 266 and the second z-axis motor mount face 268 may be spaced apart along both the x-axis and the y-axis. Further, the first z-axis motor mount face 266 may be facing a first direction while the second z-axis motor mount face 268 may be facing a second direction that is opposite the first direction. The first and second z-axis motor mount faces 266, 268 may each include a removed portion 276a, 276b configured to reduce the weight of the second body structure 214.

In one embodiment, the first and second mount faces 266, 268 may be located such that when mounted the vertical z-axes of first and second z-axis motors 220, 222 are spaced at least 18 mm apart. In other embodiments, the first and second mount faces 266, 268 may be located such that when mounted the vertical z-axes of first and second z-axis motors 220, 222 are spaced no more than 18 mm apart. In yet other embodiments, the first and second mount faces 266, 268 may be located such that when mounted the vertical z-axes of the first and second z-axis motors 220, 222 are spaced at least 16 mm apart. In one embodiment, the first and second mount faces 266, 268 may be located such that when mounted the vertical z-axes of the first and second z-axis motors 220, 222 are spaced at least 18 mm apart in total and at least 10 mm apart along the x-axis. Thus, the first and second mount faces 266, 268 may be located such that when mounted the vertical z-axes of the first and second z-axis motors 220, 222 are spaced on a diagonal relative the x-axis and the y-axis.

Extending to the top of the upper structural portion 260 is an upper stanchion 270, post, or the like configured to provide for a second attachment location. The upper stanchion 270 may include another opening 272 or bore configured to receive the first threaded screw 246a and the head 248a for attachment of the combined modular body structure 210 to the spindle bank 100a, 100b.

The lower structural portion 262 extends downward from the middle structural portion 258. The lower structural portion 262 includes a depth extending from a front end 277 along the y-axis. The lower structural portion 262 includes a lower rectangular removed portion 273 configured to reduce the weight of the second body structure 214. The lower structural portion 262 may be a U-shaped structure extending from the middle portion 258. The front end 277 of the U-shaped structure of the lower structural portion 262 includes a first linear track 278 mounted or otherwise attached to a front surface and a second linear track 280 mounted or otherwise attached to an opposing back surface such that the first linear track 278 and the second linear track 280 each extend along the z-axis.

A first body 282 is shown attached to the first linear track 278 and a second body 284 is shown attached to the second linear track 280. As shown in FIGS. 7-8 and described herein below, the first body 282 is operably connected to the first z-axis motor 220 such that the first body 282 moves along the first linear track 278 when the first z-axis motor 220 is actuated. Similarly, the second body 284 is operably connected to the second z-axis motor 222 such that the second body 284 moves along the second linear track 280 when the second z-axis motor 222 is actuated. The first and second bodies 282, 284 may each be linear bearing systems configured to integrate with the first and second linear tracks 278, 280, respectively. In one embodiment, the first and second bodies 282, 284 may be configured to slidably move along the first and second linear tracks 278, 280, respectively. In other embodiments, the first and second bodies 282, 284 may house rollers or wheels configured to facilitate movement along the first and second tracks 278, 280. To attach the first and second bodies 282, 284 to the first and second tracks 278, 280, respectively, the first and second bodies 282, 284 may be slid into the track from the bottom.

Once the first and second bodies 282, 284 are operably connected to the first and second z-axis motors 220, 222, respectively, the downward z-axis motion of the first and second bodies 282, 284 may be restricted by the movement of the first and second z-axis motors 220, 222 in order to securably attach the first and second bodies 282, 284 onto the first and second tracks 278, 280.

Figure 6:
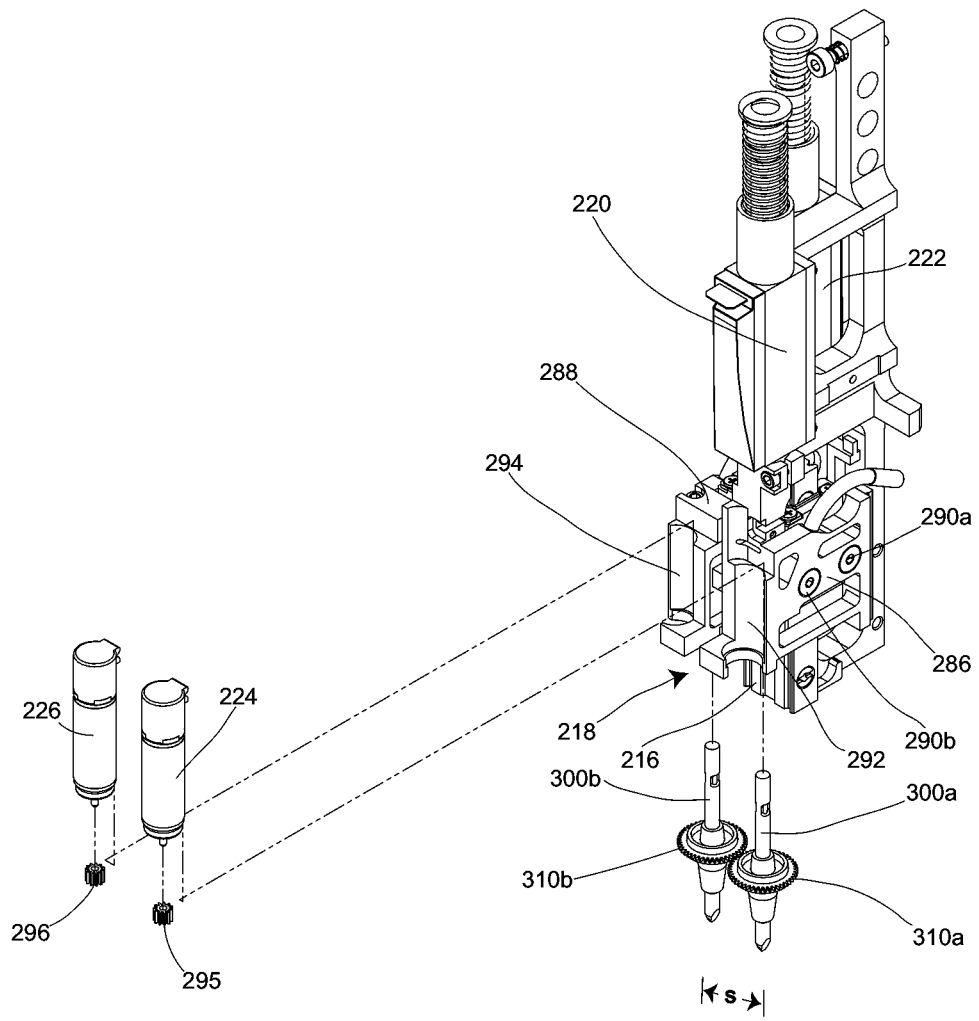
FIG. 6 depicts a partially exploded view of the spindle module of FIG. 3 in accordance with one embodiment.

Referring now to FIG. 6, a partially exploded view of the second body structure 214 is shown having the first z-axis motor 220 and the second z-axis motor 222 already attached, the first theta motor 224 and the second theta motor 226 disassembled from the second body structure 214, and the first and second spindles 300a, 300b disassembled from the first and second receiving locations 216, 218, respectively. A third body structure 286 is shown attached to the first body 282 and a fourth body structure 288 is shown attached to the second body 284. The third and fourth body structures 286, 288 are shown attached to the first and second bodies 282, 284 through screws or bolts 290a, 290b which may be threadably received by openings 291a, 291b (shown in FIG. 4) in the first and second bodies 282, 284. The third and fourth body structures 286, 288 may be configured for attaching the first and second theta motors 224, 226 to the movable first and second bodies 282, 284. In this manner, the first and second theta motors 224, 226 may be operably connected to the first and second bodies 282, 284, respectively. The third and fourth body structures 286, 288 may include the first and second receiving locations 216, 218, respectively for receiving the first and second spindles 300a, 300b. Further, the third and fourth body structures 286, 288 may include a location at the top that interfaces with and/or otherwise attaches to an extending portion of the z-axis motor 220, 222.

Each of the third and fourth body structures 286, 288 may include a theta motor attachment location 292, 294 configured to receive the first and second theta motors 224, 226, respectively. The theta motor attachment locations 292, 294 may each be semi-circular in shape. The theta motor attachment locations 292, 294 may be offset from the receiving locations 292, 294, respectively, such that motor drive gears 295, 296 of the first and second theta motors 224, 226 may be meshed with theta gears 310 of the spindle 300a, 300b. In one embodiment, the first receiving location 216 and the second receiving 218 location spaced apart by a spacing S equal to or less than 10 mm. In other embodiments, the spacing S may be equal to or less than 8 mm. In still other embodiments, the spacing may be equal to or less than 12 mm.

Figure 7A:
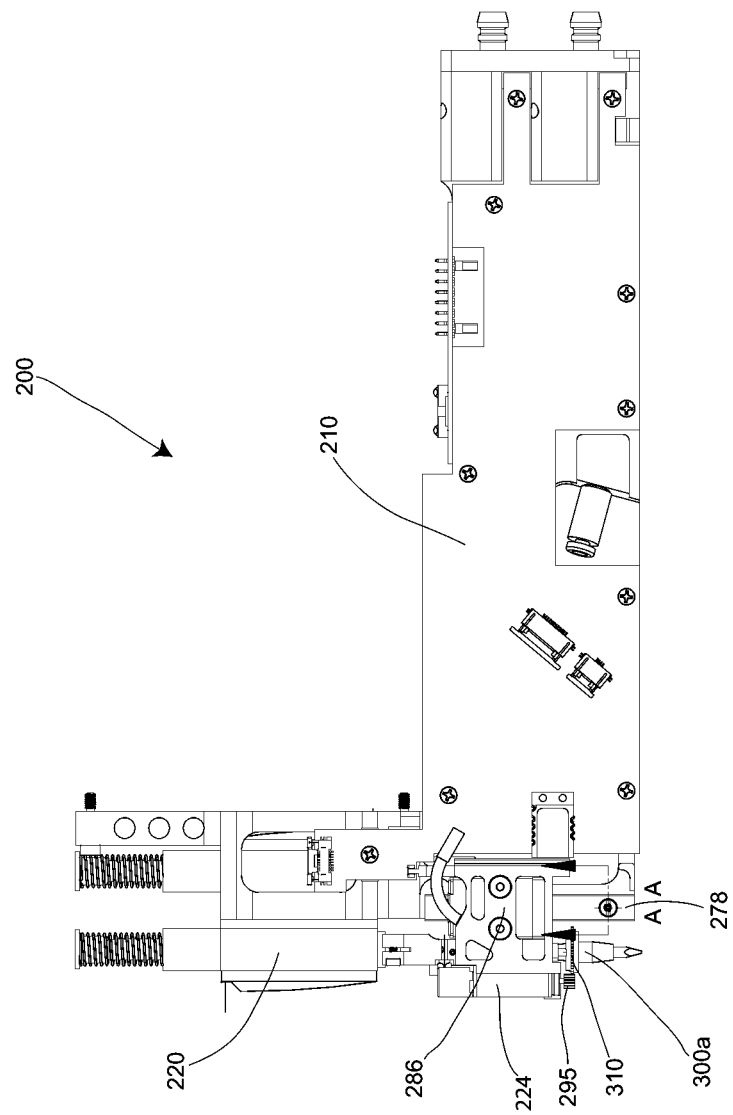
FIG. 7A depicts a side view of the spindle module of FIG. 3 in accordance with one embodiment.
Figure 7B:
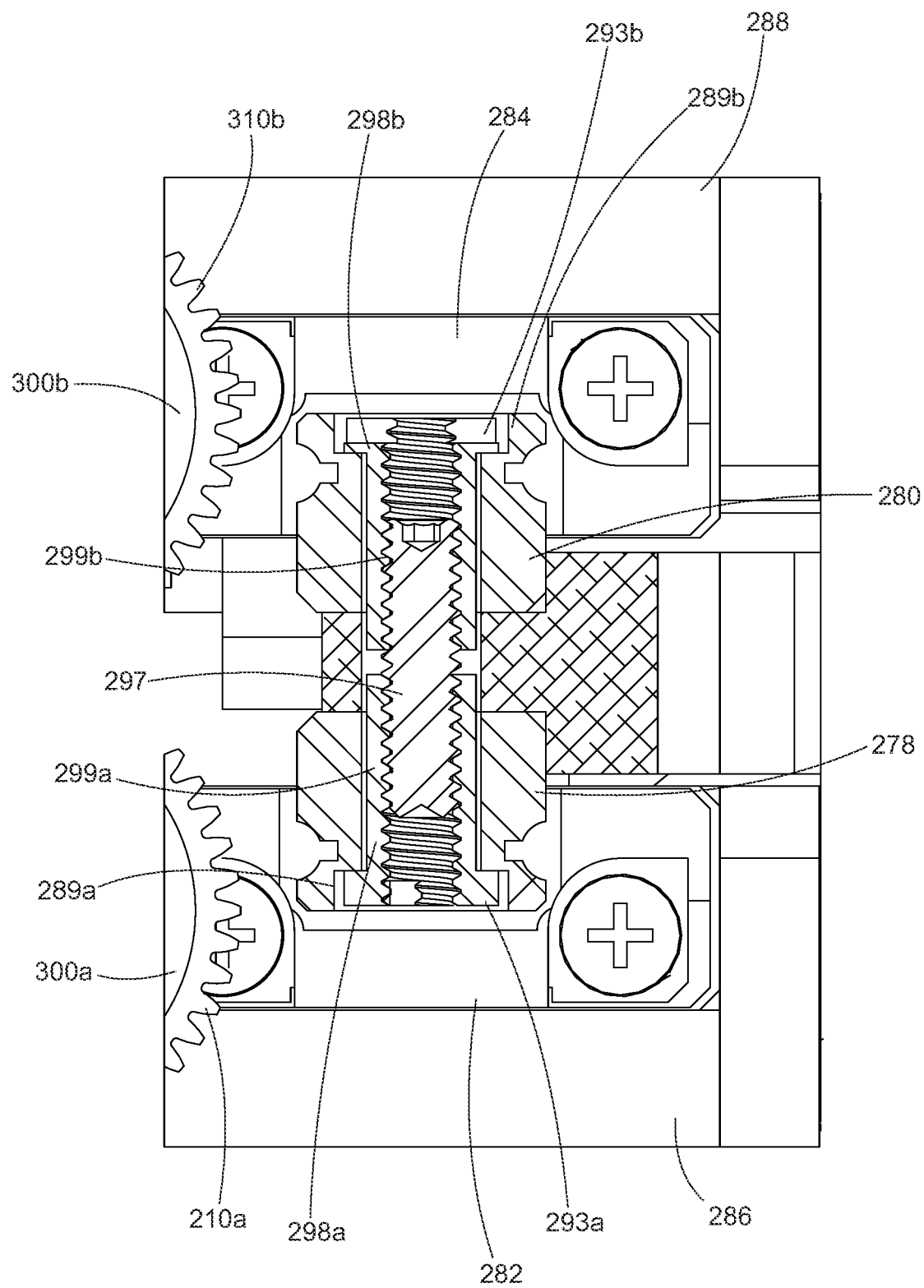
FIG. 7B depicts a cross sectional view of the spindle module of FIG. 7A taken at arrows A-A in accordance with one embodiment.
Figure 8:
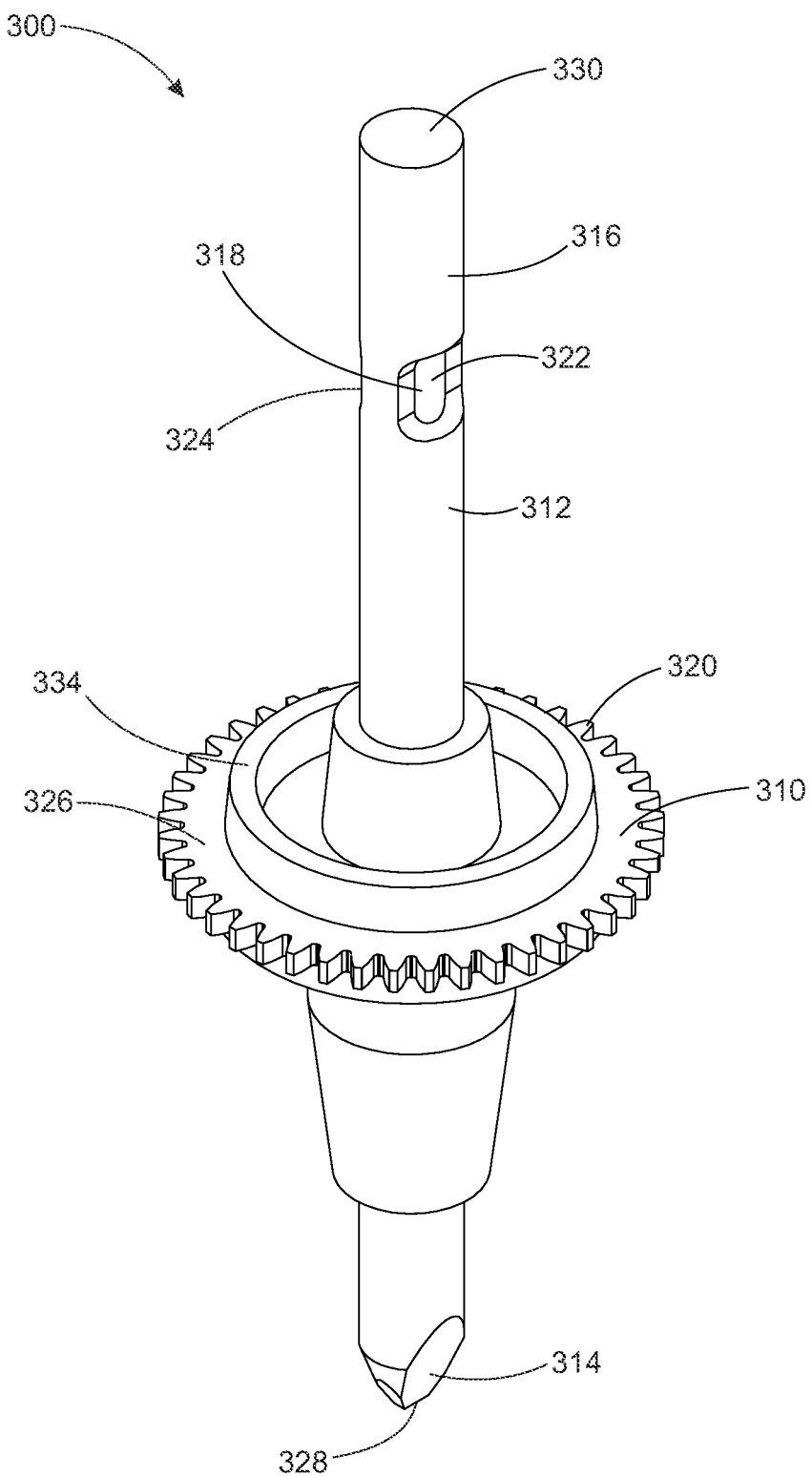
FIG. 8 is a perspective view of a spindle nozzle in accordance with one embodiment.

Referring now to FIGS. 7A and 7B, a mechanism and method for connecting the first and second linear tracks 278, 280 to the second body structure 214 is shown. In particular, FIG. 7A shows a side view of the spindle module 200. FIG. 7B shows a cross sectional view of the second body structure 214 of the spindle module 200 at a location where the first and second linear tracks 278, 280 are connected, taken at arrows A-A. As shown in FIG. 7B, the first linear track 278 and the second linear track 280 are attached to the lower structural portion 262 of the second body structure 214 of the modular body structure 210 of the spindle module 200 with a set screw 297 extending between a first nut 298a and a second nut 298b. The set screw 297 may include exterior threads as shown. Each of the first and second nuts 298a, 298b may include an internally threaded nut body 299a, 299b configured to receive the exterior threads of the set screw 297.

The first and second linear tracks 278, 280 may include bores 289a, 289b, configured to receive a heads 293a, 293b, respectively, of the first and second nuts 298a, 298b. In particular, the first linear track 278 may include the first bore 291a configured to receive the first head 293a of the first nut 298a when tightened such that the first nut 298a does not interfere with movement of the first body 282 on the first linear track 278. Similarly, the second linear track 280 may include a second bore 291b configured to receive the second head 293b of the second nut 298b when tightened such that the second nut 293b does not interfere with movement of the second body 284 on the second linear track 280.

To connect the first and second linear tracks 278, 280 to the second body structure 214, the process includes inserting the set screw 297 into an opening in each of the first and second linear tracks 278, 280 while aligned with an opening of the second body structure 214, then inserting the nuts 298a, 298b such that the internally threaded nut body 299a, 299b engages with the external threads of the set screw 297. Next, the process includes tightening the first and second nuts 298a, 298b until tight. In one embodiment, only a single set screw and nut combination may be required to fully attach the first and second linear tracks 278, 280. In another, a second set screw may extend between a third nut and a fourth nut at a spaced apart location from the first set screw 297, the first nut 298a, and the second nut 298b. An embodiment having two set screws is shown in the Figures (e.g. FIG. 4) where two heads 293a of the set screws are shown recessed in the track, one at a top of the linear track 278 and one at the bottom of the linear track 278.

Figure 9:
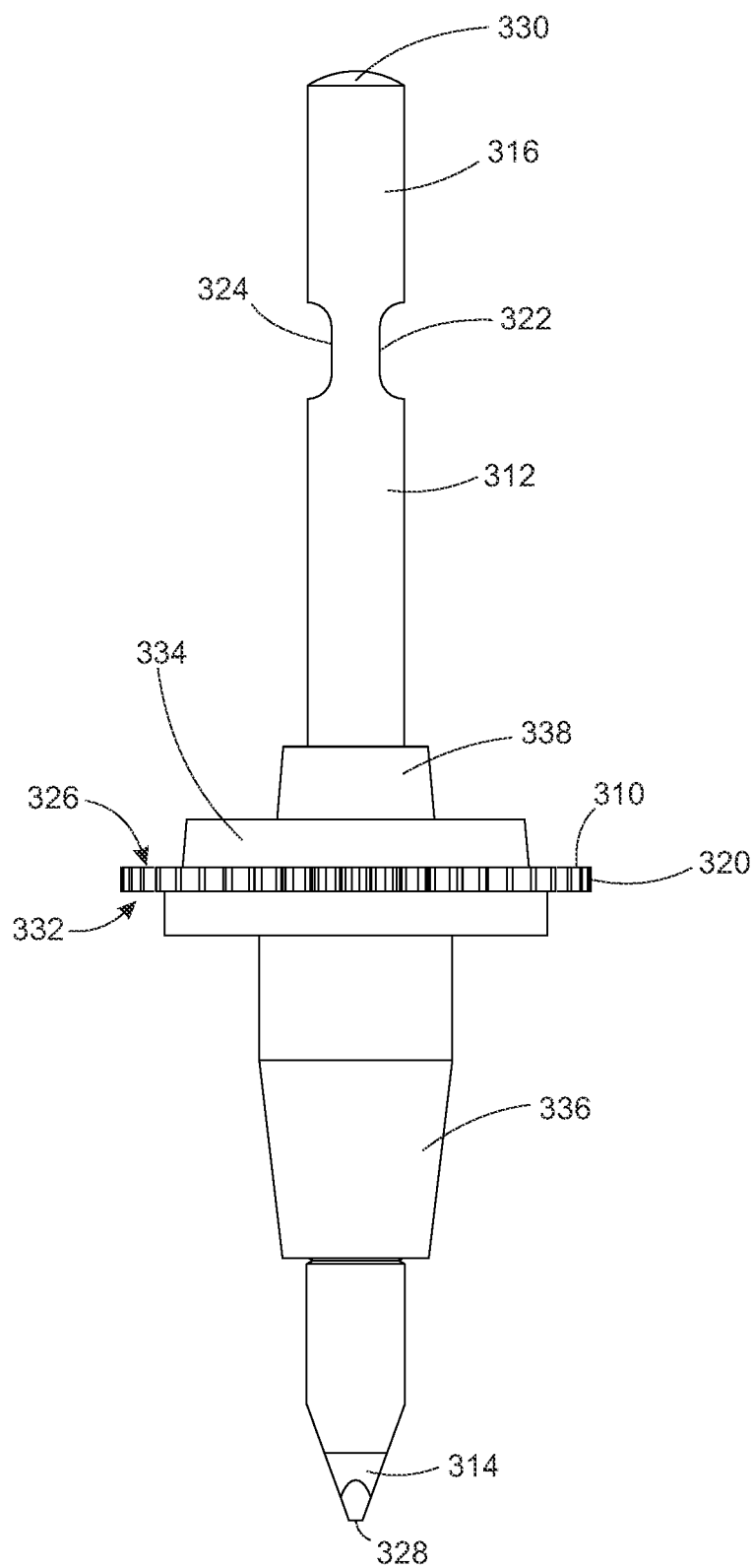
FIG. 9 is a side view of the spindle nozzle of FIG. 12 in accordance with one embodiment.

Referring now to FIGS. 8 and 9, a spindle 300 is shown. In particular, FIG. 8 shows a perspective view of the spindle 300 and FIG. 9 shows a side view of the spindle. The spindle 300 may include the same features as the spindles 300a, 300b. The spindle 300 includes a theta gear 310, a shaft 312 and a nozzle tip 314. The spindle 300 may extend between a first lower end 328 and a second upper end 330.

The spindle 300 may be considered a spindle-nozzle combination. The nozzle tip 314 is configured to contact an electronic component for manipulation of the electronic component. Additionally, the spindle 300 may include the rotatable shaft 312 and the theta gear 310 to facilitate rotation. The spindle 300 may be configured for interchangeability on, or removably attachable to, a dispensing or pick-and-place head (such as the spindle bank 100 and the spindle module 200 combination). The spindle 300 may be found in a nozzle bank of the assembly machine 10 when it is not attached to the spindle module 200 and/or spindle bank 100.

The spindle 300 may be configured to provide vacuum suction to the electronic component through the nozzle tip 314 to allow for the picking up, or other manipulation, of electronic components by the nozzle tip 314. To provide airflow or a vacuum force to the nozzle tip 314, the shaft 312 may include an outer body 316 having a hollow interior 318. The spindle 300 may be configured to provide an airkiss outward airflow through the nozzle tip 314 to the electronic component to facilitate placement of electronic components. In other embodiments, other types of nozzles may be contemplated for the spindle 300, such as nozzles configured to provide a material to an unfinished product.

The theta gear 310 may be disposed onto the shaft 312. The theta gear 310 may include a plurality of teeth 320 evenly disposed about the circumference of the theta gear 310. The teeth 320 of the theta gear 310 may be configured to engage with a theta motor such as one of the theta motors 224, 226. For example, the teeth 320 may be configured to engage with a motor drive gear, such as one of the motor drive gears 295, 296, of the theta motors 224, 226.

The shaft 312 may be cylindrical in shape. The theta gear 310 may be secured to, attached to, or otherwise integrated with, the shaft 312 such that rotation of the theta gear 310 by a motor drive gear also rotates the shaft 312. In some embodiments, the theta gear 310 may be a separately manufactured component from the shaft 312. The theta gear 310 may include a circular inner opening configured to receive the shaft 312.

The outer body 316 of the rotatable shaft 312 includes a first opening 322 configured to receive airflow into the hollow interior 318. For example, the airflow tube 236 of the spindle module 200 may be configured to deliver airflow through the first opening 322 into the hollow interior. The outer body 316 of the rotatable shaft 312 includes a second opening 324 configured to receive airflow into the hollow interior 318. The airflow tube 236 of the spindle module 200 may be configured to deliver airflow through the second opening 324 into the hollow interior. The second opening 324 may be disposed on an opposite side of the rotatable shaft 312 than the first opening 322. While the embodiment shown in FIGS. 8 and 9 includes two openings 322, 324, more or less openings are contemplated. As shown, the each of the first and second openings 322, 324 may be disposed about the outer body 316 of the rotatable shaft 312 at a point along a length of the shaft.

The theta gear 310 may further include an upper surface 326 facing the second upper end 330, and a lower surface 332 facing the first lower end 328. The theta gear 310 may include an outer circumference with the teeth 320 disposed along the outer circumference. The theta gear 310 may further include a circumferential ridge 334 extending from the upper surface 326 toward the first lower end 328. The circumferential ridge 334 may be a ring, protrusion, or the like, and may be located between the outer circumference of the theta gear 310 and the shaft 312.

The theta gear 310 may further include a lower base 336 and an upper base 338. The lower base 336 may extend from the lower surface 332 toward the first lower end 328 of the spindle 300. The lower base 336 may be located proximate the opening of the theta gear 310 and may extend along a length of the opening of the theta gear 310 and along a length of the shaft 312. The lower base 336 and the upper base 338 may be configured to provide support for the attachment of the theta gear 310 to the shaft 312.

In one embodiment, the shaft 312 may be made of a magnetic material to facilitate magnetic attachment of the spindle 300 to a receiving location, such as one of the receiving locations 216, 218, of a dispensing head or pick-and-place head such as the spindle module 200 and/or the spindle bank 100. The magnetic material may provide for removable attachment of the spindle 300 to the dispensing head or pick-and-place head, as described hereinbelow.

The spindle 300 is shown as a spindle-nozzle combination that includes a toothed arrangement for being driven by a tooth drive gear. However, the spindle 300 may also be a spindle-nozzle combination where the theta gear is a magnetic gear rather than a toothed gear. A magnetic theta gear may be driven by a magnetic theta motor. Whatever drive mechanism utilized the spindle 300 may include a nozzle and an integrated means to provide for rotation of the nozzle.

Figure 10:
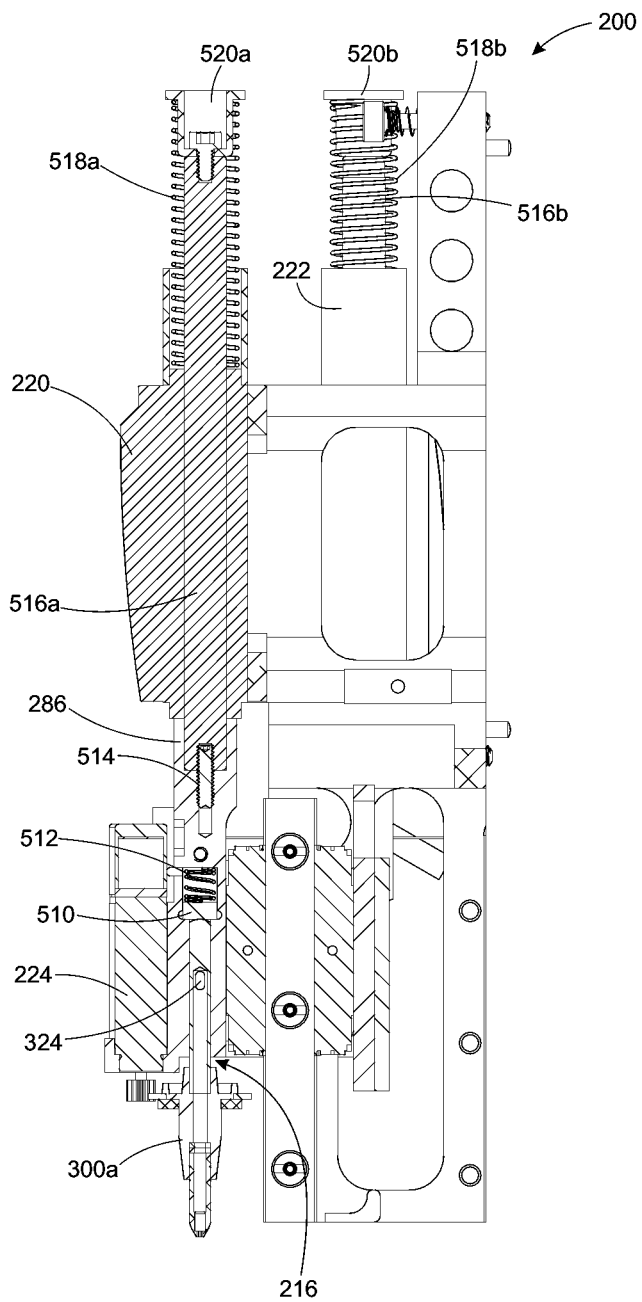
FIG. 10 depicts a side cutaway view of the spindle module of FIG. 3 in accordance with one embodiment.

Referring now to FIG. 10, a side cutaway view of the spindle module 200 of FIG. 3 is shown. In particular, FIG. 10 shows the attachment of the first z-axis motor 220 to the third body structure 286. It should be understood that the features that are described hereinbelow as shown with respect to the first z-axis motor 220 and the third body structure 286 may be applicable to the second z-axis motor 222 connecting to the fourth body structure 288.

Each of the first and second z-axis motors 220, 222 includes a movable shaft 516a, 516b, respectively, each configured to move relative to the body of the motor. Each of the first and second z-axis motors 220, 222 includes a spring 518a, 518b proximate a cap 520a, 520b. The springs 518a, 518b may be configured to return the movable shaft 516a, 516b to the start position after actuation by the z-axis motor 220, 222. The top end of each of the shafts 516a, 516b is connected to the respective caps 520a, 520b by a threaded feature of the cap being inserted into a threaded bore of the shafts 516a, 516b. A threaded set screw 514 may be located at the bottom of each of the shafts 516a, 516b connecting the shaft to the third and fourth body structures 286, 288, respectively. Thus, when the z-axis motors 220, 222 are actuated and the shafts 516a, 516b displace downward, so do the respective attached body structures, which includes the respective nozzles 300a, 300b, and the respective theta motors 224, 226.

Furthermore, the first receiving location 216 is shown after having received the first spindle 300a into a bore of the first receiving location 216. The first receiving location 216 and the shaft 312 of the first spindle 300a may include a relatively tight tolerance to allow for z-axis sliding and rotation of the shaft 312 without other movement. The shaft 312 of the first spindle 300a may be magnetic and may be attracted to a magnet 510 located or disposed within the third body structure 286. This may create a holding force to retain the first spindle 300a within the first receiving location 216. However, this holding force may be overcome by a greater force if it is desired for the first spindle 300a to be removed from the first receiving location 216. In this manner, the first spindle 300a may be removably attachable to the first receiving location 216. As shown a spindle spring 512 may be housed within the third body structure 286. This spindle spring 512 may provide a small amount of spring movement at the moment of pickup and/or placement of a component by the spindle 300a, when the spindle 300a is resisted by the upward force from the unmovable feeder bank (during pickup) and unfinished product or PCB (during placement. In other embodiments not shown, the spindle spring 512 may be replaced by a magnet that provides a resistive magnetic force on a corresponding magnet of the spindle 300a.

Figure 11:
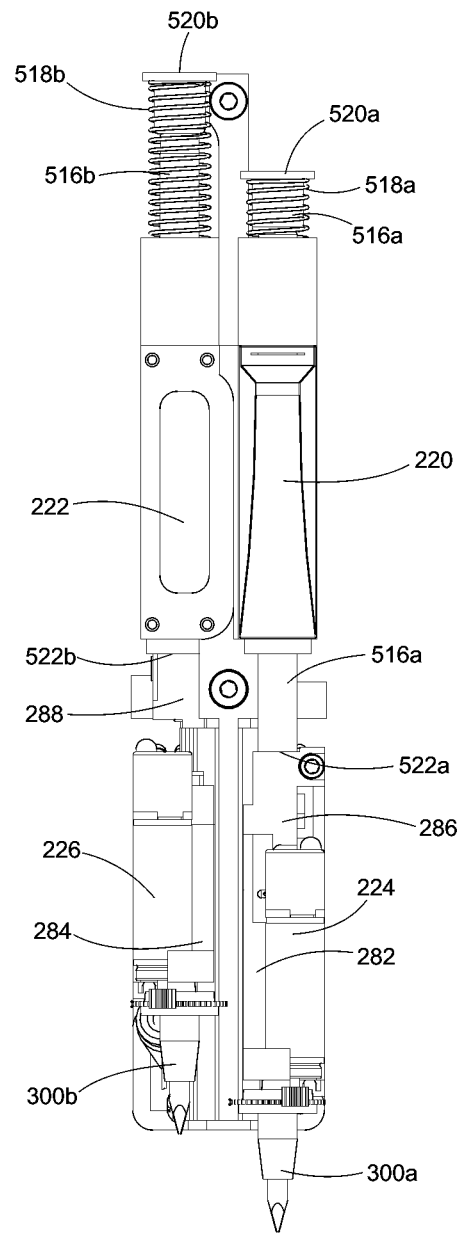
FIG. 11 depicts a front view of the spindle module of FIG. 3 with the first z-axis motor actuated in accordance with one embodiment.

FIG. 11 depicts a front view of the spindle module 200 with the first z-axis motor 220 actuated. As shown, the second z-axis motor 222 remains in the upward and non-actuated position. When actuated, the shaft 516a and spring 518a are compressed. When actuated, the shaft 518a then protrudes from the bottom of the body of the z-axis motor 220. An attachment location 522a between the shaft 518a and the third body structure 286 is thereby moved down, moving down the first body 282, the first theta motor 224, the first receiving location 216 and the first spindle 300a. Meanwhile, an attachment location 522b between the shaft 518b and the fourth body structure 288 remains stationary, along with the second body 284, the second theta motor 226, the second receiving location 218 and the second spindle 300b.

Figure 12A:
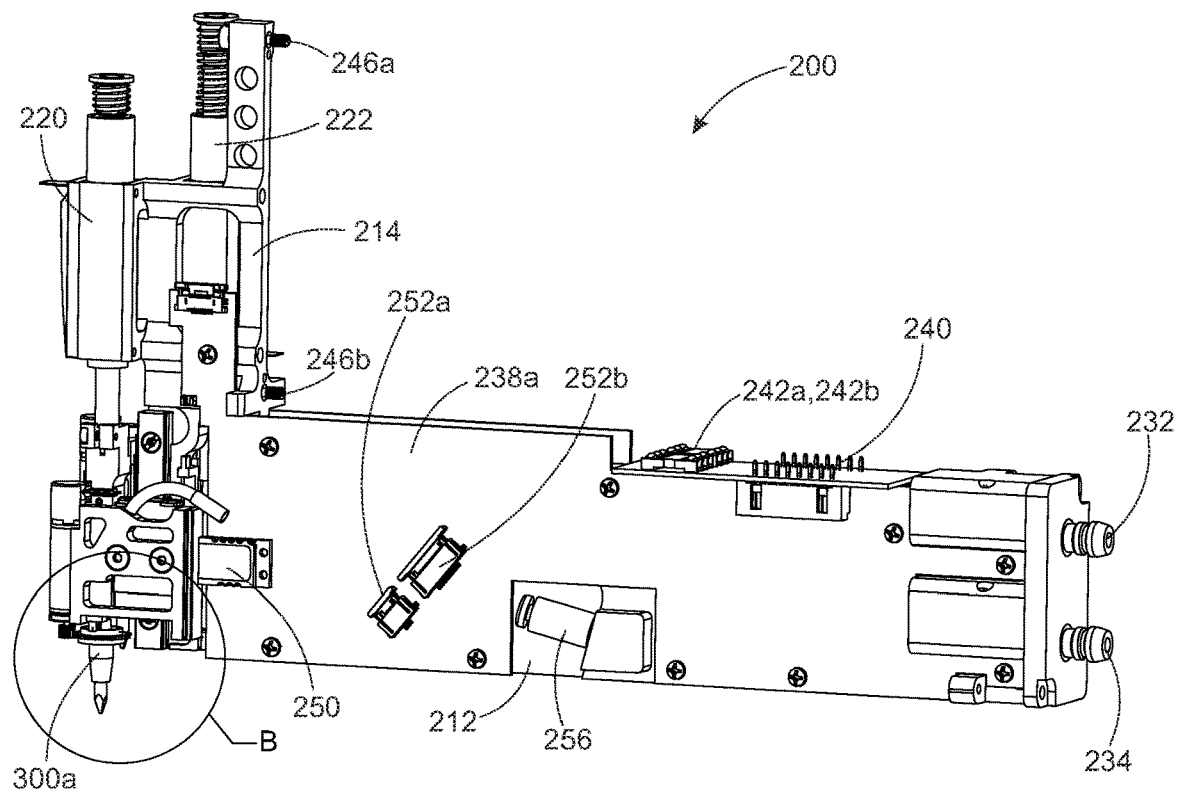
FIG. 12A depicts a perspective view of the spindle module of FIG. 3 with the first z-axis motor actuated in accordance with one embodiment.
Figure 12B:
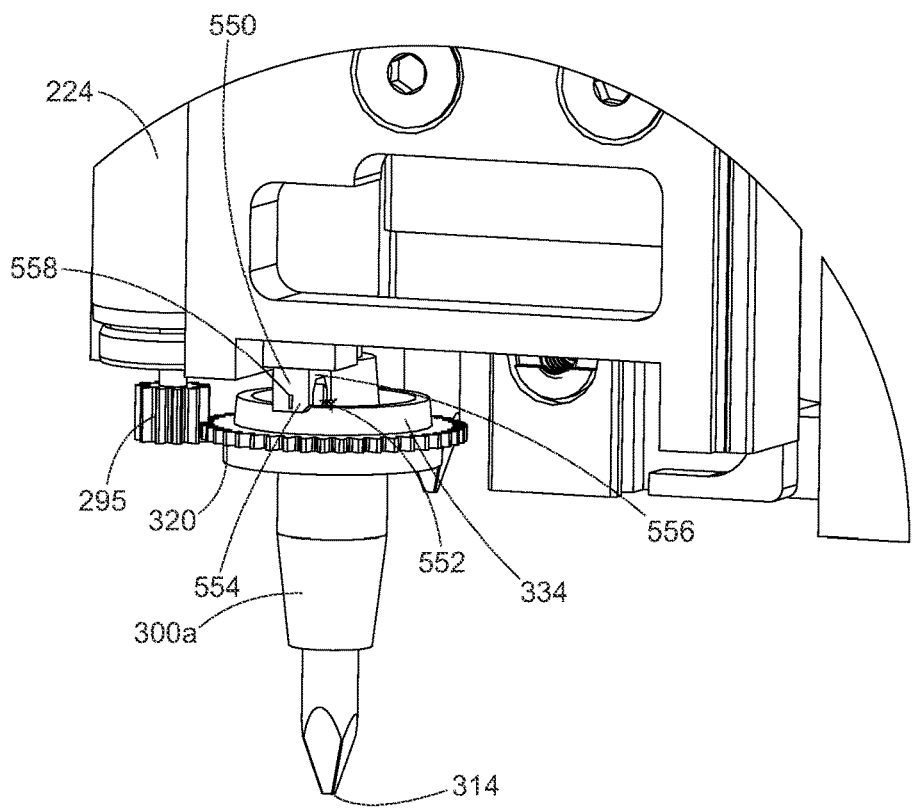
FIG. 12B depicts a perspective view of a portion of the spindle module of FIG. 12A enlarged at circle B in accordance with one embodiment.

FIG. 12A depicts a perspective view of the spindle module 200 with the first z-axis motor 220 actuated and having a circle B drawn around a portion of the spindle 300a. FIG. 12B depicts a perspective view of a portion of the spindle module 200 enlarged at the circle B. The enlarged view from FIG. 12B shows a spindle module optical detector 550 extending from the third body structure 282 attached to the first body 282. The optical detector 550 may be configured to detect upward movement of the received first spindle 300a relative to the first body 282 and the third body structure 282. It should be understood that the spindle module 200 may include a second optical detector positioned in the same manner detecting movement of the second received spindle 300b.

As shown in FIG. 12B, the spindle 300a is in a resting downward position before the spindle 300a contacts an electronic component for picking up, or before the spindle 300a contacts the PCB or other unfinished product during placement. During this resting position, the teeth 320 of the spindle 300a mesh with the teeth of the first theta motor drive gear 295. Further, the circumferential ridge 334 of the first spindle 300a does not extend into an opening 552 located between a first end 554 and a second end 556 of the optical sensor 550. The first end 554 of the optical sensor 550 may include an optical light beam generator 558 and the second end 556 of the optical sensor 550 may include an optical light detector. When the circumferential ridge 334 is positioned in the opening 552, the circumferential ridge 334 may break the beam. This may be configured to immediately detect when touchdown has occurred during pickup and/or placement.

Figure 13A:
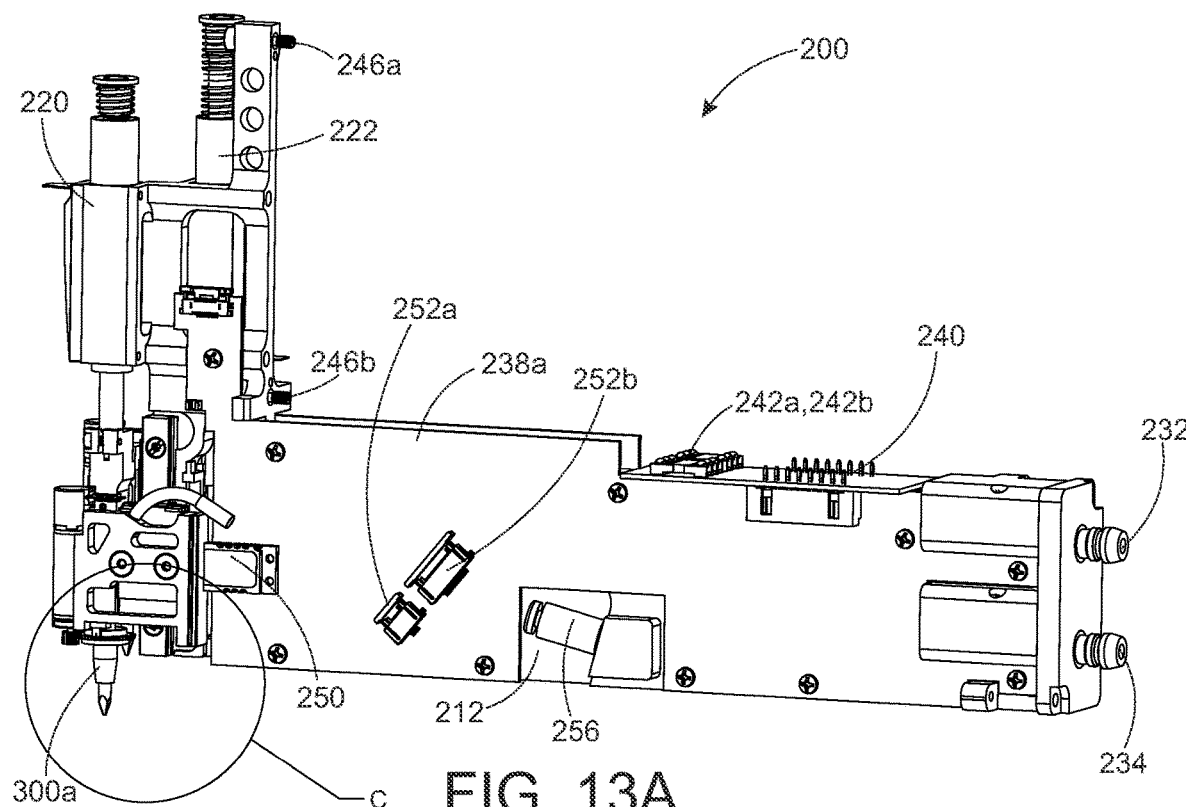
FIG. 13A depicts a perspective view of the spindle module of FIG. 3 with the first z-axis motor actuated in accordance with one embodiment.
Figure 13B:
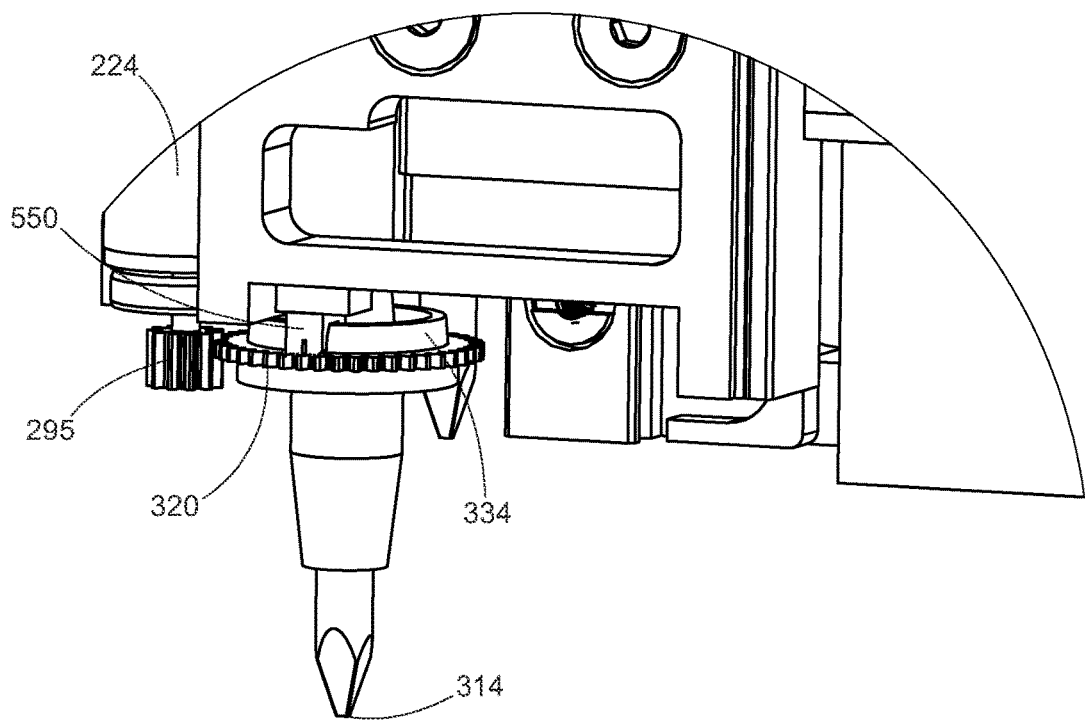
FIG. 13B depicts a perspective view of a portion of the spindle module of FIG. 13A enlarged at circle C in accordance with one embodiment.

FIG. 13A depicts a perspective view of the spindle module 200 with the first z-axis motor 220 actuated and having a circle C drawn around a portion of the spindle 300a. FIG. 13B depicts a perspective view of a portion of the spindle module 200 enlarged at circle C. As shown in FIG. 13B, the spindle 300a has now been moved upward relative to the first body 282 and the third body structure 282. Thus, the circumferential ridge 334 is positioned in the opening 552, thereby breaking the beam of the optical sensor 550. It should further be noted that the first theta motor drive gear 295 includes a height that is large enough to maintain contact with the teeth 320 of the nozzle 300a during motion of the nozzle 300a relative to the first theta motor drive gear 295. In one embodiment, the first theta motor drive gear 295 may include a height that is larger than the maximum movement allowable between the spindle 300a and the first body 282 and the third body structure 282.

Figure 14:
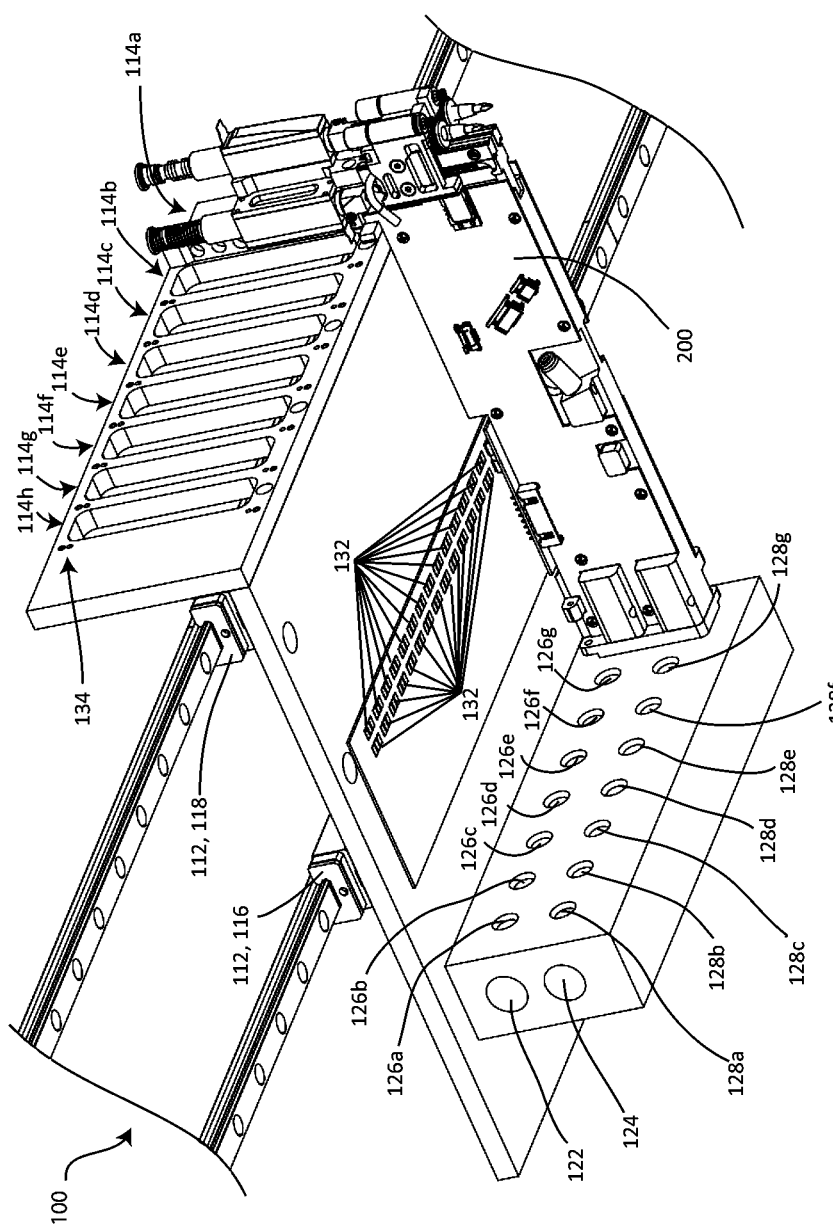
FIG. 14 is a perspective view of a spindle bank in accordance with one embodiment.

Referring first to FIG. 14, the spindle bank 100 having a single one of the spindle modules 200 attached. The spindle bank 100 includes the base 110 and the mounting locations 114a, 114b, 114c, 114d, 114e, 114f, 114g, 114h. In the embodiment shown, the base 110 includes eight of the mounting locations 114a, 114b, 114c, 114d, 114e, 114f, 114g, 114h. In other embodiments, more or less mounting locations are contemplated. For example, a spindle bank may have as little as a single mounting location, or as many mounting locations as would, when attached to the spindle bank 100, span across half the width of the assembly machine, minus half the width of the intended unfinished product the assembly machine is intended to at least partially assemble. Such an arrangement would enable even the left and rightmost spindles in the spindle module to reach each point along the x-axis of the unfinished product.

Each of the plurality of mount locations 114a, 114b, 114c, 114d, 114e, 114f, 114g, 114h are configured to receive a mountable spindle module, such as the mountable spindle module 200 as shown. The spindle bank 100, when combined with one or more spindle modules 200 may be a dispensing head or pick-and-place head for the assembly machine 10. Unlike typical dispensing heads and pick-and-place heads, the spindle bank 100 may provide a modular design for simple mechanical attachment and removal of individual modular spindle modules, such as the spindle module 200. The modular nature of the spindle attachment may provide for simpler maintenance when a spindle assembly needs repair. Further, while the spindle module 200 was described hereinabove as an example, various other spindle modules may fit into the spindle bank 100, such as the spindle module 500, shown in FIG. 15. The modularity of the spindle bank 100 and spindle module combination may provide flexibility to the system. The dispensing head defined by the spindle bank 100 and the spindle modules 200, 500 can be easily reconfigured with various spindle modules in whatever configuration needed by an assembly process.

In the embodiment shown, the center of each of the mount locations 114a, 114b, 114c, 114d, 114e, 114f, 114g, 114h may be spaced less than 25 mm apart. In other embodiments, the center of each of the mount locations 114a, 114b, 114c, 114d, 114e, 114f, 114g, 114h may be spaced less than 20 mm apart. Any spacing is contemplated for the mount locations 114a, 114b, 114c, 114d, 114e, 114f, 114g, 114h, but it may be difficult but desirable to reduce the spacing by making each of the spindle modules 200 as thin as possible in order to reduce the size and weight of the spindle bank 100. The above described structure of the spindle module includes various features that provide for thin spindle modules 200 such as the spacing of the z-axis motors 220, 222, the features of the modular body structure 210, and the like.

The spindle bank 100 includes a bearing system 112 comprising a first bearing 116 and a second bearing 118 for attaching the spindle bank 100 to the movement axis of an assembly machine, such as the third movement axis 36 or the fourth movement axis 38. The bearing system 112 may cooperate with a track found in the movement axis 36, 38 of the assembly machine 10. In other embodiments, the bearing system 112 of the spindle bank 100 may include wheels or balls to facilitate movement (not shown). In other embodiments, the bearing system 112 may include other shaped channels for integrating with a track system. In still others, the spindle bank 100 may include a powered bearing system that uses wheels or magnetism to move the spindle bank 100 along the attached movement axis. In others, the axis includes the movement system and the spindle bank 100 is unpowered for the purposes of movement but instead attaches to the axis and is moved by the movement system powered by the axis. In some embodiments, a permanent magnet and coil system may be utilized in which the spindle bank 100 acts as either the permanent magnet(s) or the moveable coil(s), and the axis acts as the other of the permanent magnet(s) or the movable coil(s). The spindle bank 100 may include any system for movably attaching the spindle bank 100 to one or more axis for movement.

The spindle bank 100 further includes an air distribution system including a first inlet 122 and a second inlet 124. The first inlet 122 and the second inlet 124 may each be connected to a tube or other air delivery system from the assembly machine. A channel may extend from the first air inlet 122 with various air outlets 126a, 126b, 126c, 126d, 126e, 126f, 126g configured to each deliver air to an air distribution port, such as the first air distribution port 232 of the spindle module 200. Similarly, a channel may extend from the second air inlet 124 with various air outlets 128a, 128b, 128c, 128d, 128e, 128f, 128g configured to each deliver air to an air distribution port, such as the second air distribution port 234 of the spindle module 200. It should be understood two air outlets of the spindle bank 100 are hidden by the attached spindle module 200 in the embodiment shown in FIG. 14. In this manner, the plurality of mount locations 114a, 114b, 114c, 114d, 114e, 114f, 114g, 114h may each be configured to deliver air to each of the mountable spindle modules when the modules are mounted.

The spindle bank 100 may further include a power delivery system to delivery electrical power and/or signals to each of the plurality of mount locations 114a, 114b, 114c, 114d, 114e, 114f, 114g, 114h. The power delivery system is shown including a set of electrical connectors 132. The set of electrical connectors 132 may be configured to connect to the electrical distribution ports 242a, 242b of each of the spindle modules 200. The spindle bank 100 may include one or more electrical input connectors (not shown) to provide electrical power and/or other signals to the spindle bank 100 that are wired to the electrical connectors 130, 132 disposed at the plurality of mount locations 114a, 114b, 114c, 114d, 114e, 114f, 114g, 114h.

Each of the plurality of mount locations 114a, 114b, 114c, 114d, 114e, 114f, 114g, 114h may include a first threaded attachment location 134 configured to receive the first threaded screw 246a of the spindle module 200. Each of the plurality of mount locations 114a, 114b, 114c, 114d, 114e, 114f, 114g, 114h may include a second threaded attachment location 136 configured to receive the second threaded screw 246b of the spindle module 200. The first threaded attachment locations 134 and the second threaded attachment locations 136 may each be threaded bores. Thus, as described above, each spindle module 200 may be mounted and removed from the spindle bank 200 by the application or removal of two threaded screws. A hand tool, such as a screwdriver, Allen wrench, wrench, or the like may be the only tool necessary for attachment of the spindle modules 200 to the spindle bank 100.

Figure 15:
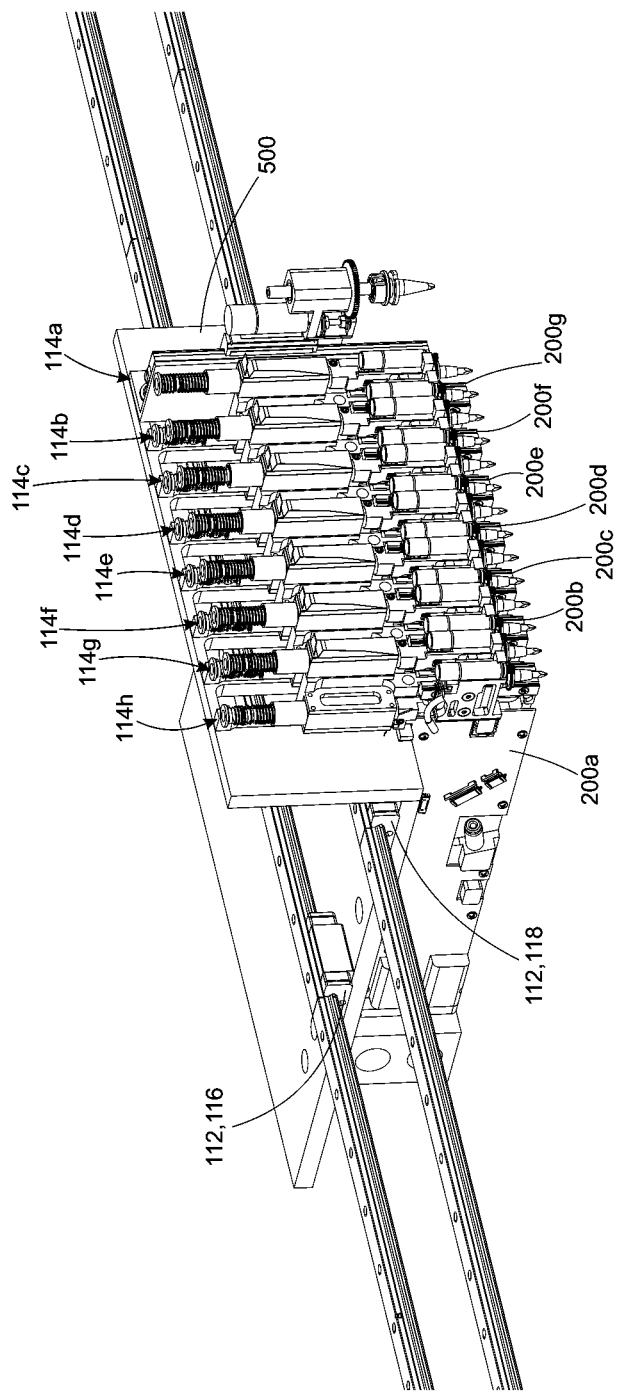
FIG. 15 is a perspective view of the spindle bank of FIG. 14 with a plurality of spindle modules attached in accordance with one embodiment.

FIG. 15 shows a plurality of spindle modules 200a, 200b, 200c, 200d, 200e, 200f, 200g attached, along with the spindle module 500 that is different from the spindle modules 200a, 200b, 200c, 200d, 200e, 200f, 200g. Thus, the plurality of mount locations 114a, 114b, 114c, 114d, 114e, 114f, 114g, 114h includes a first mount locations 114a configured to receive a first mountable spindle module 500. The plurality of mount locations 114a, 114b, 114c, 114d, 114e, 114f, 114g, 114h may include second mount locations 114b, 114c, 114d, 114e, 114f, 114g, 114h each configured to receive a second mountable spindle module 200. In some embodiments, the first mount location 114a and the second mount locations 114b, 114c, 114d, 114e, 114f, 114g, 114h may be structurally the same. In other embodiments, the spindle bank 100 may include structural differences between mount locations. Thus, the first mountable spindle module 500 is different than the second mountable spindle modules 200a, 200b, 200c, 200d, 200e, 200f, 200g. For example, the first mountable spindle module 500 includes a single spindle and nozzle, while each of the second mountable spindle modules 200a, 200b, 200c, 200d, 200e, 200f, 200g include two spindle and nozzles. In accommodating different spindle modules, the first mount location 114a may include at least one different physical property than the second mount locations 114b, 114c, 114d, 114e, 114f, 114g, 114h. Spindle banks accommodating various different spindle modules with differences in features or physical properties at the mount locations are contemplated.

While not shown, it is also contemplated that the spindle bank 100 includes one or more motion control chips for each of the plurality of mount locations 114a, 114b, 114c, 114d, 114e, 114f, 114g, 114h. The embodiment shown includes the motion control chips 250 attached to each of the attachable spindle modules 200. However, in other embodiments, these motion control chips may be found on the spindle bank 100. Whatever the embodiment, the dispensing head or pick-and-place head defined by the combination of the spindle bank 100 and the attached spindle modules 200, 500 may include a number of control chips 250 equal to the number of spindles. In other embodiments, each spindle module 200 includes a single one of the control chips 250 dedicated to the two spindles located on the module.

Various methods are contemplated for assembling unfinished products, or assembling assembly machines, utilizing the assembly machines, dispensing heads, spindles, spindle mounting modules and spindle banks described hereinabove.

For example, a method of assembly may include providing a pick-and-place machine, such as the assembly machine 10, having a pick-and-place head, such as the combination of the spindle banks 100 and one or more of the spindle modules 200. The method may include providing a spindle, such as the spindle 300, for the pick-and-place machine. The method may include attaching the spindle to the pick-and-place head of the pick-and-place machine. The method may include engaging, by a theta gear of the spindle, with a motor, such as the first theta motor 224, of the pick-and-place head. The method may include contacting, by the spindle, an electronic component, or a portion thereof. The method may include manipulating, by the spindle, the electrical component. The method may include removing the spindle from the pick-and-place head of the pick-and-place machine to a spindle bank of the pick-and-place machine. The method may include receiving, by at least one opening in the shaft of the spindle, air flow into a hollow interior of the spindle from an air delivery system of the pick-and-place head and utilizing the airflow during the manipulating. The method may include picking up, with the nozzle, the electrical component using the airflow, and placing, with the nozzle, the electronic component using the airflow. The method may include rotating, with the motor of the pick-and-place head, the theta gear of the spindle and rotating, by the rotating of the theta gear, the shaft and the nozzle tip of the spindle. The method may include breaking, by a circumferential ridge of the spindle, a beam of an optical sensor, such as the optical sensor 550, disposed on the pick-and-place head. The method may include sensing, by the optical sensor, movement by the nozzle relative to at least a portion of the pick-and-place head. The method may include rotating, by the motor, the theta gear by a magnetic force. The method may include receiving, by a magnet of a receiving location of the pick and place head, the shaft such that the magnetic material interacts with the magnet of the receiving location.

Another method of assembly may include providing a pick-and-place machine, such as the assembly machine 10 having a first movement axis, such as the third movement axis 36 or the fourth movement axis 38. The method may include providing a spindle bank, such as the spindle bank 100, for a pick-and-place machine. The method may include mounting, on each of a plurality of mount locations of the spindle bank, a mountable spindle module, such as the spindle module 200, 500, including at least one pick-and-place spindle and nozzle, such as the spindle and nozzle combination 300. The method may include assembling, by the received mountable spindle modules, at least one unfinished product. The method may include distributing air, by an air distribution system of the assembly machine, to the spindle bank, and distributing the air, by a second air distribution system of the spindle bank, to each of the mountable spindle modules after the mounting. The method may include distributing electrical power, by an electrical power distribution system of the assembly machine, to the spindle bank, and distributing the electrical power, by a second electrical power distribution system of the spindle bank, such as the electrical connectors 130, 132, to each of the mountable spindle modules after the mounting. The method may include receiving, by at least one threaded attachment location of the spindle bank such as the threaded attachment locations 134, 136, at least one threaded attachment component of the at least one of the mountable spindle modules, such as the screws 246a, 246b. The method may include using, by an installer, only a hand tool and attaching the at least one of the mountable spindle modules to a selected one of the plurality of mount locations. The method may include attaching a bearing system of the spindle bank, such as the bearing system 112, to the first movement axis. The method may include moving the spindle bank along the first movement axis by the pick-and-place machine. The method may include attaching the first movement axis to a second movement axis of the pick-and-place machine, such as the first movement axis 32 and/or the second movement axis 34, and moving the spindle bank along the second movement axis by the pick-and-place machine. The method may include mounting a first mountable spindle module to a first mount location of the spindle bank and mounting the second mountable spindle module to a second mount location, wherein the second mountable spindle module is different than the first and wherein the second mount location includes different physical properties than the first mount location.

Another of assembly may include providing a pick-and-place machine, such as the assembly machine 10, having a first movement axis, such as the third movement axis 36 or the fourth movement axis 38. The method may include providing a spindle bank, such as the spindle bank 100 attached to the pick and place machine such that the spindle bank is movable along the first movement axis. The method may include providing a first pick-and-place spindle module, such as the spindle module 200. The method may include attaching, using a mechanical attachment mechanism such as the screws 246a, 246b, the first pick-and-place spindle module to the spindle bank such that an air distribution port, such as one of the air distribution ports 232, 234, is connected to receive air from an element, such as air outlets 126a, 126b, 126c, 126d, 126e, 126f, 126g of the spindle bank and the electrical distribution port, such as the electrical distribution ports 240a, 240b, 242a, 242b is connected to receive electricity from an element, such as the electrical connectors 130, 132 of the spindle bank. The method may include receiving, by a receiving location of the modular body structure, a first spindle, such as the spindle 300. The method may include moving, by a first z-axis motor such as the z-axis motor 220, the received first spindle in a z-axis. The method may include rotating, by a first theta motor such as the first theta motor 224, the received first spindle. The method may include delivering, by the air distribution system, received air from the air distribution port to the received first spindle. The method may include delivering, by the electrical distribution system, received electricity from the electrical distribution port to the received first spindle. The method may include moving the spindle bank along the first movement axis and at least partially assembling, by the attached first pick-and-place spindle module, at least one unfinished product. The method may include attaching the first pick-and-place spindle module to the spindle bank with a hand tool. The method may include receiving, by a second receiving location of the modular body structure, a second spindle such as the spindle 300. The method may include moving, by a second z-axis motor such as the second z-axis motor 222, the received second spindle in the z-axis. The method may include rotating, by a second theta motor such as the second theta motor 226, the received second spindle. The method may include delivering, by the air distribution system, received air from the air distribution port to the received second spindle and delivering, by the electrical distribution system, received electricity from the electrical distribution port to the received second spindle. The method may include moving, by the first z-axis motor, a first body, such as the first body 282, along a first linear track, such as the first linear track 278. The method may include moving, by the second z-axis motor, the second body, such as the second body 284, along a second linear track, such as the second linear track 280. The method may include attaching the first linear track and the second linear track to the modular body structure with a set screw, such as the set screw 297 extending between a first nut and a second nut, such as the first and second nuts 298a, 298b.

The method may further include controlling, with a first motion control chip of the spindle module, such as the motion control chip 250, the first z-axis motor and the first theta motor. The method may include controlling, with a second motion control chip, the second z-axis motor and the second theta motor.

The method of assembly may also include providing a second pick-and-place spindle module, such as the spindle module 500 or 200. The method may include attaching, using the mechanical attachment mechanism, the second pick-and-place spindle module to the spindle bank such that the air distribution port of the second pick-and-place spindle module is connected to receive air from an element of the spindle bank and the electrical distribution port of the second pick-and-place spindle module is connected to receive electricity from an element of the spindle bank. The method may include receiving, by a receiving location of a modular body structure of the second pick-and-place spindle module, a spindle. The method may include moving, by the first z-axis motor of the second pick-and-place spindle module, the received spindle of the second pick-and-place spindle module in a z-axis. The method may include rotating, by the first theta motor of the second pick-and-place spindle module, the received spindle of the second pick-and-place spindle module. The method may include delivering, by the air distribution system of the second pick-and-place spindle module, received air from the air distribution port of the second pick-and-place spindle module to the received spindle of the second pick-and-place spindle module. The method may include delivering, by the electrical distribution system of the second pick-and-place spindle module, received electricity from the electrical distribution port of the second pick-and-place spindle module to the received spindle of the second pick-and-place spindle module. The method may include at least partially assembling, by the attached second pick-and-place spindle module, the at least one unfinished product. The method may still further include controlling, with a first motion control chip, the first z-axis motor of the first pick-and-place spindle module and the first theta motor of the first pick-and-place spindle module, and controlling, with a second motion control chip, the first z-axis motor of the second pick-and-place spindle module and the first theta motor of the second pick-and-place spindle module.

Methods of assembly may further include providing a pick-and-place head that includes a body structure such as the modular body structure 210 and/or the base 110 of the spindle bank 100, or any other body for a pick-and-place or dispensing head. The method may include providing a plurality of z-axis motors attached to the body structure, each configured to move a spindle in a z-axis and a plurality of theta motors attached to the body structure each configured to rotate a spindle. The method may include providing a plurality of motion control chips each attached to the body structure. The method may include controlling, with each of the plurality of motion control chips, a single one of the plurality of z-axis motors and a single one of the plurality of theta motors, and at least partially assembling, with the pick and place head, an unfinished product. The method may include controlling, with each of the plurality of motion control chips, speed of a single one of the plurality of z-axis motors and a single one of the plurality of theta motors. The method may include controlling, with each of the plurality of motion control chips, acceleration of a single one of the plurality of z-axis motors and a single one of the plurality of theta motors. The method may include controlling, with each of the plurality of motion control chips, position of a single one of the plurality of z-axis motors and a single one of the plurality of theta motors. The method may still further include creating, with each of the plurality of motion control chips, a separate independent motion control profile for each of the plurality of spindles.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed:
1. A method of assembly comprising:
providing a pick-and-place head that includes:
    a body structure having first and second receiving locations to receive first and second spindles;
    a first z-axis motor attached to the body structure, and configured to move the first spindle in a z-axis;
    a second z-axis motor attached to the body structure and configured to move the second spindle in the z-axis;
    a first theta motor attached to the body structure and configured to rotate the first spindle in a theta rotational axis;
    a second theta motor attached to the body structure and configured to rotate the second spindle in the theta rotational axis;
    a first motion control chip attached to the body structure dedicated to controlling the first z-axis motor and the first theta motor; and
    a second motion control chip attached to the body structure dedicated to controlling the second z-axis motor and the second theta motor;
creating, with each of the first and second motion control chips, a separate independent motion control profile for each of the first and second spindles;
controlling, with the first motion control chip, the first z-axis motor and the first theta motor based on the separate independent motion control profile for the first spindle;
controlling, with the second motion control chip, the second z-axis motor and the second theta motor based on the separate independent motion control profile for the second spindle; and
at least partially assembling, by the pick-and-place head, a product.

2. The method of assembly of claim 1, further comprising:
controlling, with the first motion control chip, speed of the first z-axis motor and the first theta motor; and
controlling, with the second motion control chip, speed of the second z-axis motor and the second theta motor.

3. The method of assembly of claim 1, further comprising:
controlling, with the first motion control chip, acceleration of the first z-axis motor and the first theta motor; and
controlling, with the second motion control chip, acceleration of the second z-axis motor and the second theta motor.

4. The method of assembly of claim 1, further comprising:
controlling, with the first motion control chip, position of an output of the first z-axis motor and the first theta motor; and
controlling, with the second motion control chip, position of an output of the second z-axis motor and the second theta motor.

* * * * *